US007368866B2

(12) United States Patent
Hasegawa et al.

(10) Patent No.: US 7,368,866 B2
(45) Date of Patent: May 6, 2008

(54) ENVELOPE, ENVELOPE MANUFACTURING METHOD, IMAGE DISPLAY DEVICE, AND TELEVISION DISPLAY DEVICE

(75) Inventors: Mitsutoshi Hasegawa, Kanagawa (JP); Masaki Tokioka, Kanagawa (JP); Tokutaka Miura, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 144 days.

(21) Appl. No.: 10/647,287

(22) Filed: Aug. 26, 2003

(65) Prior Publication Data

US 2004/0124426 A1 Jul. 1, 2004

(30) Foreign Application Priority Data

Aug. 28, 2002 (JP) ............................ 2002-249348

(51) Int. Cl.
*H01L 27/15* (2006.01)
*H01J 1/62* (2006.01)

(52) U.S. Cl. ......................... 313/493; 257/79; 313/634

(58) Field of Classification Search ................ 313/493, 313/634; 445/23, 45
See application file for complete search history.

(56) References Cited

U.S. PATENT DOCUMENTS 5,455,597 A 10/1995 Nakamura et al. ............ 345/75
5,659,329 A 8/1997 Yamanobe et al. ........... 345/74
6,060,113 A 5/2000 Banno et al. ............... 427/125
6,137,218 A 10/2000 Kaneko et al. ............. 313/495
6,254,449 B1 7/2001 Nakanishi et al. ............ 445/25
6,283,813 B1 9/2001 Kaneko et al. ............... 445/24
6,296,896 B1 10/2001 Takahashi et al. ............ 427/77
6,506,089 B2 1/2003 Nakanishi et al. ............ 445/25
6,624,586 B2 9/2003 Abe et al. ................ 315/169.1
2002/0180342 A1 12/2002 Yamada et al. ............. 313/493
2002/0190633 A1* 12/2002 Tagawa et al. ............. 313/483
2002/0192935 A1* 12/2002 Joshi et al. ................. 438/612

(Continued)

FOREIGN PATENT DOCUMENTS

JP 64-31332 2/1989

(Continued)

OTHER PUBLICATIONS

M. Hartwell et al, "Strong electron emission from patterned tin-indium oxide thin films", International Electron Devices Meeting 1975, Washington, D.C., Catalog No. 75, CH1023-1,IEDM Technical Digest, pp. 519-521.

*Primary Examiner*—Kiesha L. Rose
(74) *Attorney, Agent, or Firm*—Fitzpatrick, Cella, Harper & Scinto

(57) ABSTRACT

Provided is an envelope which includes: a first substrate; a second substrate opposed to the first substrate; a frame interposed between the first substrate and the second substrate; and a low melting point metal for bonding the first substrate and the frame to each other. In particular, in such a configuration, the substrate or the frame has a first region and a second region which are brought into contact with the low melting point metal, and in the first region, a material capable of higher maintaining airtightness with the low melting point metal than the second region is in contact with the low melting point metal, while in the second region, a material having a stronger binding power on the low melting point metal than the first region is in contact with the low melting point metal.

9 Claims, 16 Drawing Sheets

U.S. PATENT DOCUMENTS

| | | | | |
|---|---|---|---|---|
| 2003/0058192 | A1 | 3/2003 | Arai et al. | 345/59 |
| 2003/0067263 | A1 | 4/2003 | Tokioka et al. | 313/493 |
| 2003/0201462 | A1* | 10/2003 | Pommer et al. | 257/200 |

FOREIGN PATENT DOCUMENTS

| | | |
|---|---|---|
| JP | 6-342636 | 12/1994 |
| JP | 7-326311 | 12/1995 |
| JP | 8-185818 | 7/1996 |
| JP | 9-505757 | 2/1997 |
| JP | 9-102271 | 4/1997 |
| JP | 11-135018 | 5/1999 |
| JP | 2005-251665 | 9/2000 |
| JP | 2001-210258 | 8/2001 |
| JP | 2002-182585 | 6/2002 |
| JP | 2002-184329 | 6/2002 |

* cited by examiner

ENVELOPE, ENVELOPE MANUFACTURING METHOD, IMAGE DISPLAY DEVICE, AND TELEVISION DISPLAY DEVICE

BACKGROUND OF THE INVENTION

1. Field of the Invention

The present invention relates to an envelope capable of keeping its interior hermetically sealed and a method of manufacturing the same. The envelope is suitable for an image-forming apparatus.

2. Related Background Art

Up to now, there have been known two types of electron-emitting devices, a thermionic source and a cold cathode electron source. The cold cathode electron source includes a field emission device (hereinbelow referred to FE device), a metal/insulating-layer/metal device (hereinbelow referred to MIM device), and a surface conduction electron-emitting device (hereinbelow referred to SCE device).

Concerning those technologies, some examples of background arts proposed by the present inventor are as follows. Device formation using an inkjet formation method is described in detail in Japanese Patent Application Laid-open No. 09-102271 and Japanese Patent Application Laid-open No. 2000-251665. An example in which those devices are arranged in an XY-matrix shape is described in detail in Japanese Patent Application Laid-open No. 64-031332 and Japanese Patent Application Laid-open No. 07-326311. Further, a wiring forming method is described in detail in Japanese Patent Application Laid-open No. 08-185818 and Japanese Patent Application Laid-open No. 09-050757. A driving method is described in detail in Japanese Patent Application Laid-open No. 06-342636 and the like.

Up to now, seal bonding has been employed in manufacturing an envelope which keeps its interior vacuum. In the seal bonding, frit glass as a seal member is applied or placed between glass members, and then the entire envelope is put into a seal bonding furnace such as an electric furnace, or put on a hot plate heater (or interposed between an upper hot plate and a lower hot plate), and heated to a seal bonding temperature to melt and bond the seal bonding portions of the glass members with the seal bonding glass. An example of such an envelope manufacturing method is disclosed in Japanese Patent Application Laid-open No. 11-135018.

Japanese Patent Application Laid-open No. 2001-210258 discloses a flat panel display in which a low melting point metal is used for seal bonding. Japanese Patent Application Laid-open No. 2001-210258 also discloses use of a material that has high affinity to a low melting point metal material formed on a seal bonding surface as a measure of holding the low melting point metal material.

Flat panel displays using electron sources need ultra high vacuum in order to operate cold cathode electron-emitting devices and the like stably for a long period of time. Therefore, in such flat panel displays, a substrate having plural electron-emitting devices and a substrate having phosphors which face each other across a frame are seal-bonded to each other with frit glass and a getter is provided to maintain the vacuum state by adsorbing discharged gas.

Getters are classified into evaporables and non-evaporables. Evaporating getters are alloys each mainly containing Ba or the like. An evaporating getter is heated in a vacuum glass envelope by energization or high frequency to form an evaporation film on an inner wall of the container (getter flash), and gas generated in the container is adsorbed by an active getter metal face to maintain high vacuum.

On the other hand, non-evaporating getters are Ti, Zr, V, Al, Fe, and the like. A non-evaporating getter material is heated in vacuum for "getter activation", which gives the getter material a gas adsorbing characteristic. The getter material thus can adsorb discharged gas.

Flat panel displays in general are thin and have difficulties in finding enough space to set an evaporating getter which maintains vacuum and to provide a flash region for instant electric discharge. Accordingly, the getter setting region and the flash region are placed near a supporting frame outside the image display area. This reduces conductance between a central portion of the image display area and the getter setting region, and slows the effective exhaust speed of the electron-emitting devices and the phosphors at the central portion. In an image display device having an electron source and an image display member, the major area where produces undesirable gas is generated is the image display region which is irradiated with an electron beam. Accordingly, a non-evaporating getter has to be placed in the vicinity of phosphors and the electron source which are the sources of undesirable gas if the phosphors and the electron source are to be kept in high vacuum.

SUMMARY OF THE INVENTION

It is the objective of the present invention is to provide a break-proof envelope which can maintain its airtightness optimally.

The knowledge the present inventor have acquired as a result of extensive study is that an envelope having: a face plate; a rear plate opposed to the face plate; and an outer frame interposed between the face plate and the rear plate to encompass the perimeter, the outer frame being bonded to the face plate and to the rear plate through bonding portions one or both of which is formed of a low melting point metal material, can be made break-proof and can maintain its airtightness optimally if the one or both bonding portions have a portion where the low melting point metal material is bonded directly to the face plate or to a host material of the outer frame and a portion where the low melting point metal material is bonded to a base material that is formed on the face plate or on the host material of the outer frame. The present invention has been completed on the basis of this knowledge.

According to the present invention, there is provided an envelope including: a first substrate; a second substrate opposed to the first substrate; and a frame interposed between the first substrate and the second substrate, the envelop being characterized in that: the first substrate is bonded to the frame with a low melting point metal interposed therebetween: the first substrate has a first region and a second region which are brought into contact with the low melting point metal; and in the first region, a material capable of higher maintaining airtightness with the low melting point metal than the second region is in contact with the low melting point metal, while in the second region, a material having a stronger binding power on the low melting point metal than the first region is in contact with the low melting point metal.

According to the present invention, there is provided an envelope including: a first substrate; a second substrate opposed to the first substrate; and a frame interposed between the first substrate and the second substrate, the envelop being characterized in that: the first substrate is bonded to the frame with a low melting point metal interposed therebetween; the frame has a first region and a second region which are brought into contact with the low melting point metal; and in the first region, a material capable of higher maintaining airtightness with the low melting point metal than the second region is in contact with the low melting point metal, while in the second region, a material having a stronger binding power on the low melting point metal than the first region is in contact with the low melting point metal.

According to the present invention, there is provided a method of manufacturing an envelope that has: a first substrate; a second substrate opposed to the first substrate; and a frame interposed between the first substrate and the second substrate, the method including a step of: bonding the first substrate and the frame to each other with a low melting point metal, the method being characterized in that, in the bonding step, used as the first substrate is a substrate that: has a first region and a second region which are brought into contact with the low melting point metal; in the first region, is capable of higher maintaining airtightness with the low melting point metal than in the second region; and in the second region has a stronger binding power on the low melting point metal than in the first region.

According to the present invention, there is provided a method of manufacturing an envelope that has: a first substrate; a second substrate opposed to the first substrate; and a frame interposed between the first substrate and the second substrate, the method including a step of: bonding the first substrate and the frame to each other with a low melting point metal, the method being characterized in that, in the bonding step, used as the frame is a frame that: has a first region and a second region which are brought into contact with the low melting point metal; in the first region, is capable of higher maintaining airtightness with the low melting point metal than in the second region; and in the second region, has a stronger binding power on the low melting point metal than in the first region.

With this structure, an envelope which can maintain its airtightness optimally and which hardly becomes unbonded is obtained.

The present application also provides an image display device using the above envelope. A television display device using the above envelope is also included in the present invention.

DESCRIPTION OF THE PREFERRED EMBODIMENTS

The present invention will be described below through specific depictions of embodiments.

Embodiment 1

Figure 1:
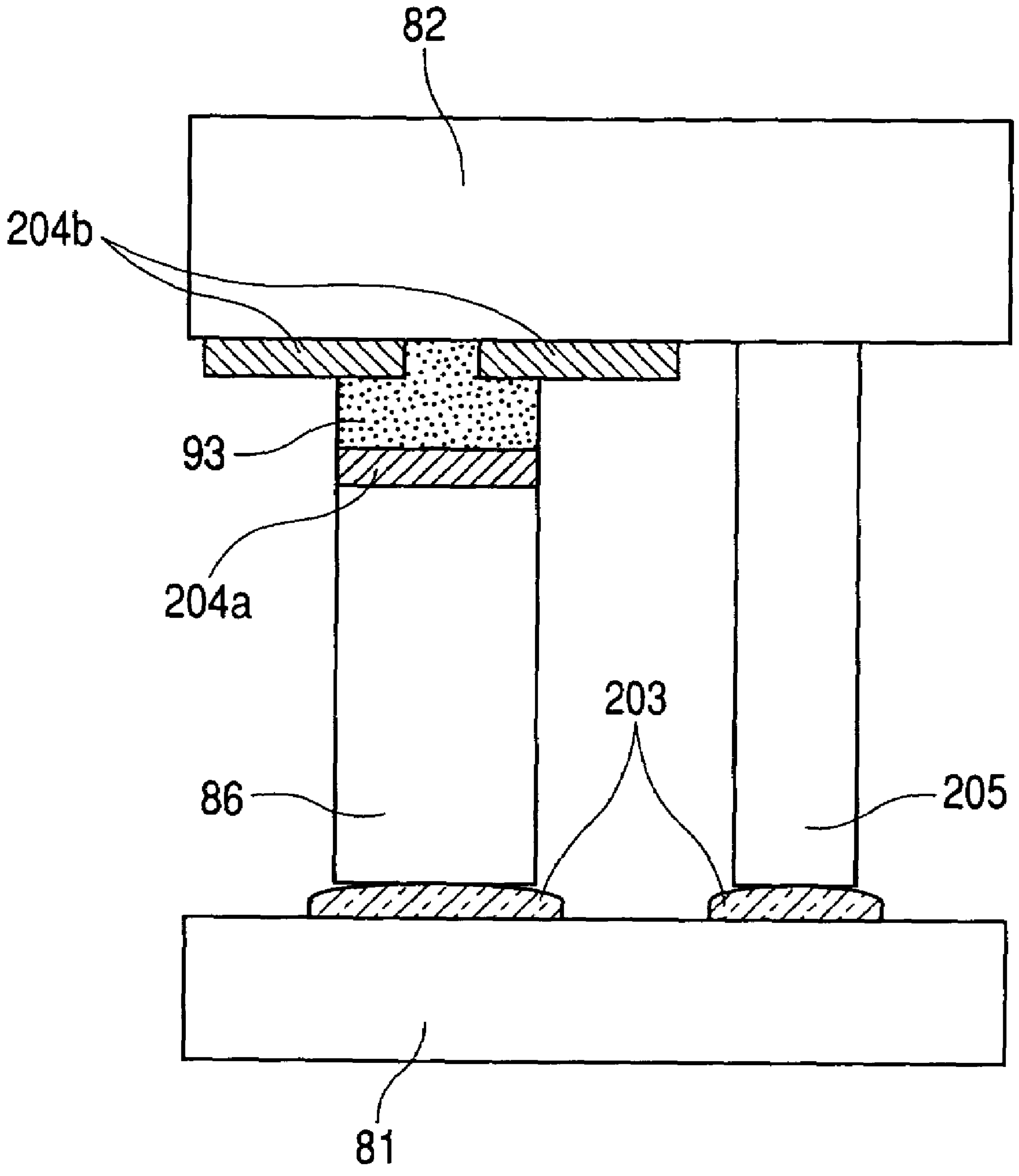
FIG. 1 is a schematic diagram which outlines a sectional structure of a peripheral portion of an example of an envelope according to the present invention.
Figure 12:
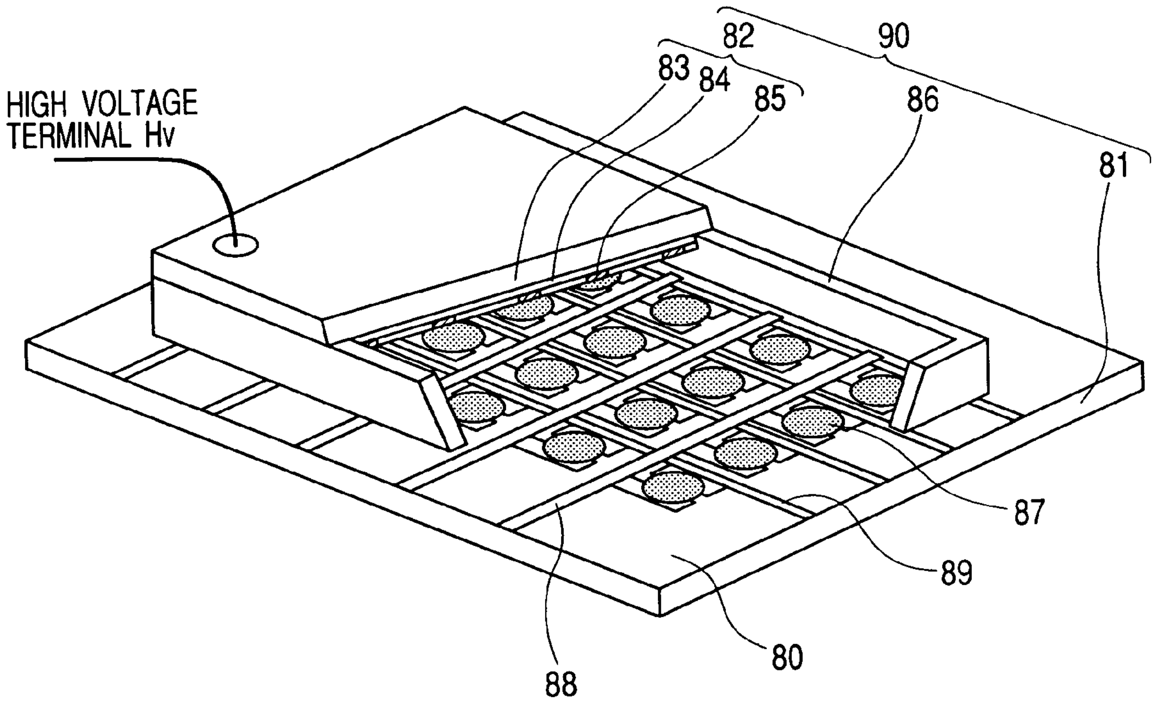
FIG. 12 is a structural diagram which outlines an example of a display panel of an image forming apparatus.

FIG. 12 is a schematic diagram which outlines a structural example of an envelope. FIG. 1 is a schematic diagram which outlines a sectional structure of a peripheral portion of an envelope according to Embodiment 1. In a peripheral portion of an envelope 90, a face plate 82 which is a first substrate and a supporting frame 86 are bonded to each other through an In film 93 which is a low melting point metal. Reference numeral 80 denotes an electron source with a large number of electron-emitting devices arranged thereon. Denoted by 81 is a glass substrate having the electron source substrate 80 on one side. The substrate 81 is called a rear plate which is a second substrate. The face plate 82 is composed of a glass substrate 83 and a fluorescent film and metal back which line the inner surface of the glass substrate 83. A supporter called a spacer 205 is set between the face plate 82 and the rear plate 81 to give the envelope 90 enough strength against atmospheric pressure even when used in a large area panel. Frit glass 203 adheres the spacer 205 and the supporting frame 86 to the rear plate 81 and then the bond is fixed by baking at 400 to 500° C. for 10 minutes or longer. The height of the supporting frame 86 and the height of the spacer 205 are determined such that, after adhered to the rear plate 81 by the frit glass 203, the spacer 205 stands slightly higher than the supporting frame 86. This determines the thickness of the In film 93 after the bonding. Accordingly, the spacer 205 also functions as a member for ruling the thickness of the In film 93. The In film 93 adheres the supporting frame 86 to the face plate 82. The metal In is chosen because the In film 93 releases only little gas even at high temperature and has a low melting point. A low melting point metal in the present invention is a metal (alloy included) having a melting point of 300° C. or lower, preferably 200° C. or lower. Examples of such low melting point metal that is employable include In and Sn, and an alloy containing In or Sn. Specific examples of such alloy include In—Ag and In—Sn. A metal (alloy included) is desirable as a bonding member since no solvent or binder is contained in the metal and accordingly very little gas is discharged when the metal is melted at its melting point. The supporting frame 86 and the face plate 82 have underlayers 204*a* and 204*b*, respectively, in order to enhance the adhesion at the interfaces. The underlayers in this embodiment are formed of silver, which has excellent wettability with the metal In. The silver underlayers 204*a* and 204*b* are readily formed by screen printing or similar patterning of silver paste. The underlayer 204*b* is a first region of the face plate 82, which is the first substrate and which, in this embodiment, is bonded on top of the other substrate in seal bonding. The underlayer 204*b* is not formed in the center of the face plate 82. In this embodiment, the center portion where no underlayer 204*b* is formed (namely, the region where a host material of the substrate is exposed) is a second region. ITO films, Pt films, or like other metal thin films which are readily formed by vacuum evaporation may be employed as the underlayers 204*a* and 204*b* instead of silver films. Before the face plate 82 and the rear plate 81 are bonded, in other words, seal-bonded, the In film 93 is formed by patterning in advance. A method of forming the In film 93 on the supporting frame 86 that is adhered to the rear plate 81 is described with reference to FIGS. 16A and 16B. First, the supporting frame 86 is warmed to a temperature high enough to raise the wettability of molten In and is kept in this state. 100° C. or higher temperature will do. Since the silver paste films as the underlayers 204 have high glass adhesion but are porous films with a lot of pores, it is preferable to impregnate the underlayers 204 thoroughly with molten In, thereby preventing vacuum leakage. This is achieved by melting In at a high temperature equal to or higher than its melting point and soldering the molten In to the underlayers 204 with a supersonic soldering iron 1205. It is sufficient if the liquid In has a temperature equal to the melting point. A not-shown replenishing measure supplies the bonding portions with the metal In as the need arises by keeping supplying In to the tip of the soldering iron. The In film 93 is thus formed. The initial thickness of the In film 93 is from several tens μm to 1 mm, which is much thicker than the thickness of the In film 93 after the bonding. The moving speed of the supersonic soldering iron 1205 and the In supply amount are adjusted to give the In film 93 the above initial thickness. In this embodiment, an In film with a thickness of 500 μm is soldered to the supporting frame 86 to give the In film 93 after the seal bonding a thickness of 300 μm.

Figure 16:
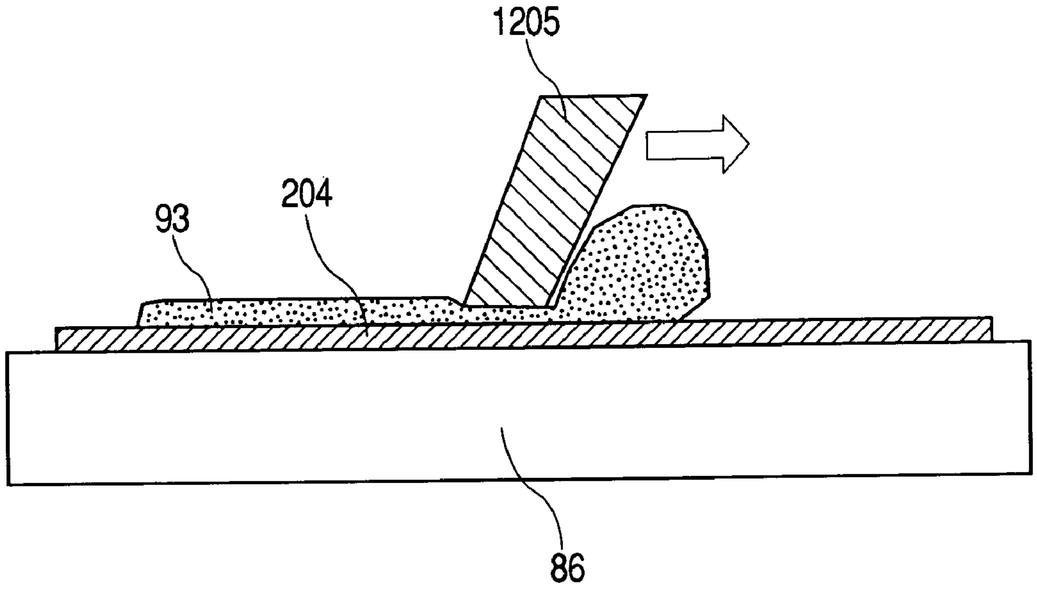
FIG. 16 is a structural diagram which outlines an example of how an In film is formed.
Figure 17:
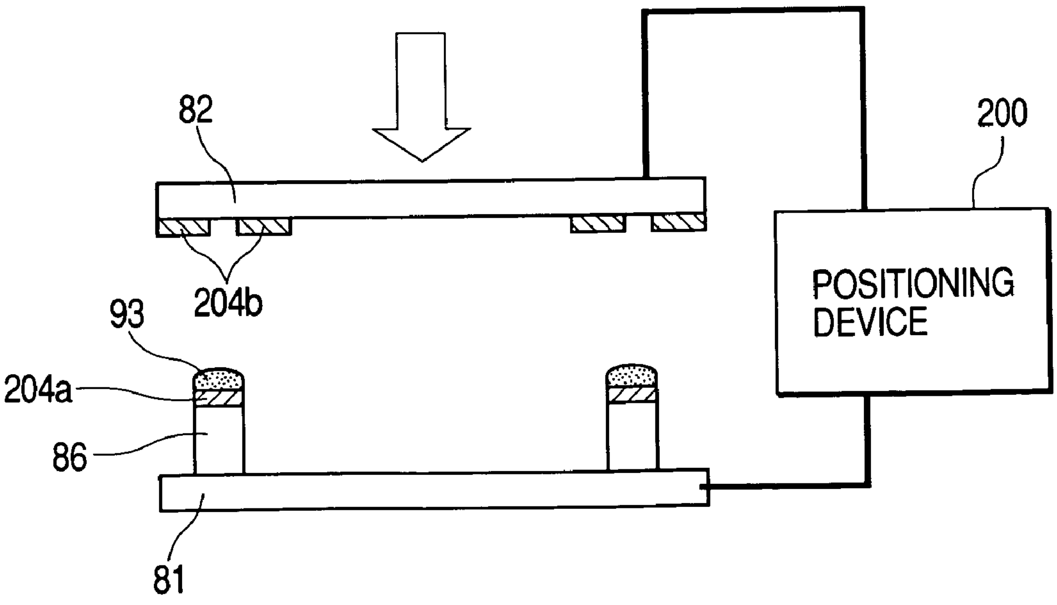
FIG. 17 is a structural diagram which outlines an example of seal bonding.

After the In film 93 is formed on the underlayer of the supporting frame 86 by the method shown in FIG. 16, the envelope 90 is completed using a seal bonding method illustrated in FIG. 17. With the face plate 82 and the rear plate 81 facing each other across a fixed gap, the substrates are held and subjected to vacuum heating. For vacuum heating, high temperature substrate vacuum baking is conducted at 300° C. or higher, so that the interior of the envelope 90 can have a satisfactory vacuum level after the temperature returns to room temperature despite gas released from the substrates during the vacuum heating. At this point, the In film 93 is in a melted state. The rear plate 81 substrate has to be leveled sufficiently, on the order of 1 mm/1 m or less, in advance so as not to let the molten In flow out. After the vacuum baking, the temperature is lowered to a level near the melting point of In and then the gap between the face plate 82 and the rear plate 81 is gradually closed by a positioning device 200 until the substrates are bonded, in other words, sealed. The temperature is lowered to a level near the melting point in order to reduce a fluidity of the liquid In obtained by melting the metal In, thus preventing the liquid In from running off to unintended places.

Now, a description is given on the state of the interface where the In film 93 formed on the face plate 82 is bonded to the In film 93 formed on the rear plate 81. Each In film 93 formed by the method shown in FIG. 16 has a surface oxide film on its surface. The melting point of the oxide film is 800° C. or higher. The oxide film therefore stays as a crystalline solid and keeps its surface shape upon seal bonding, meaning that the oxide film remains as an oxide film interface inside the In film and could form a leak path, which causes vacuum leakage. In practice, the oxide film is thin and is easily broken by stress upon bonding, allowing the liquid In to seep from the inside for convection and rendering the remaining oxide harmless. Still, a leak path could be formed in a portion where the oxide film is locally thick. In addition, if the In film itself is varied in thickness, a leak path could be formed in a portion where the In film 93 is not thick enough.

This embodiment reduces fluctuation in thickness of the In film 93 by forming no In film on the face plate 82 and leveling the In film 93 on the frame 86 when In is melted, before seal bonding at the latest.

The adhesion is stronger in the portion where the host material of the substrate is directly bonded to In than in the portion where the underlayer 204*b* is bonded to In. The portion where the underlayer 204*b* is boned to In is superior in airtightness to the portion where In is bonded to the host material of the substrate.

In the present invention, the relative difference in ability to maintain airtightness can be checked as follows. A first envelope and a second envelope are prepared. The first envelope has a bonding portion only between a low melting point metal and a first region (in this embodiment, a region where a silver underlayer is formed on the host material of the substrate). The second envelope has a bonding portion only between a low melting point metal and a second region (a region where the host material of the substrate alone is present. As to the rest, the first envelope and the second envelope have equal conditions). A hole is opened in each envelope to hook each envelope to a He leakage detector. Then, He gas is blown into spaces surrounding the envelopes. The ability to maintain airtightness is measured by detection values of the He leakage detectors.

In the present invention, the relative difference in binding power can be checked as follows. A first member and a second member are prepared. The first member has on its surface a first region (in this embodiment, a region where a silver underlayer is formed on the host material of the substrate). The second member has on its surface a second region (a region where the host material of the substrate alone is present). A low melting point metal is interposed between the first and second members and is bonded to the first and second members. The two bonded members are tested by a tensile tester and the difference in binding power is measured by observing which interface is easier to pull off. If the interface between the low melting point metal and the first member (first region) is more readily peeled off than the interface between the second member (second region) and the low melting point metal (if more of the low melting point metal clings to the second member after the first member and the second member are separated from each other), then the binding power of the first region over the low melting point metal is weaker than that of the second region.

As mentioned above, the oxide film is much thinner than the bulk despite it being a crystalline solid. With the pressure applied to the liquid In, the force generated in a stepped portion of the underlayer 204*b* upon bonding is large enough to break the oxide film. When the oxide film is broken locally, if the surface oxide film is not broken on the entire bonding face, convection of the liquid In is started from the broken portions and the oxide film flows out from the bonding face to the peripheral portions along with excess liquid In, thus removing the oxide film from the bonding face. This embodiment reduces an incidence rate of leakage even more by providing a level difference between the first region where the underlayer 204*b* is formed and the second region which has no underlayer 204*b*.

Figure 15A:
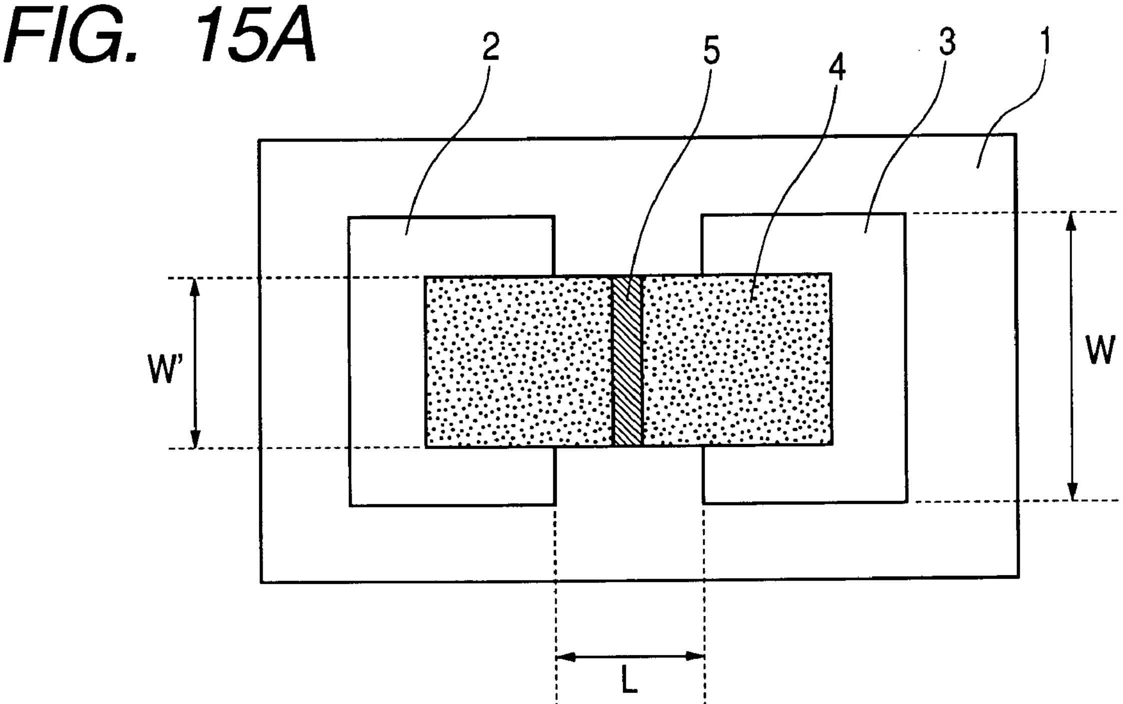
FIGS. 15A and 15B are schematic diagrams showing an example of an electron-emitting device.
Figure 15B:
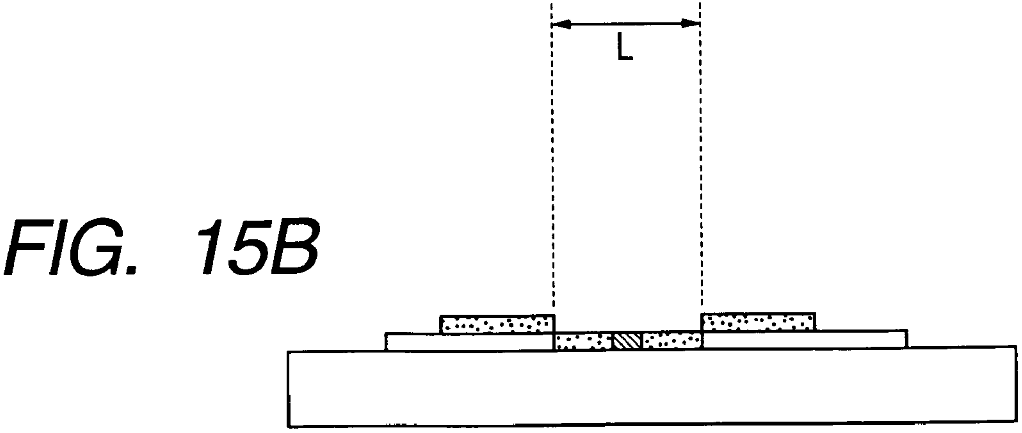

Next, a description is given on a process of forming each structural component of image-forming apparatus that has an envelope constructed in accordance with this embodiment. First, an electron-emitting device as the one shown in FIGS. 15A and 15B is formed on an electron source substrate side of a rear plate. FIG. 15A is a plan view of this electron-emitting device and FIG. 15B is a sectional view thereof.

This electron-emitting device has the above-described M. Hartwell device structure, which is a typical surface conduction electron-emitting device structure.

In FIGS. 15A and 15B, reference numeral 1 denotes a substrate formed of glass or the like. The size and thickness of the substrate are set to suite the number of electron-emitting devices to be placed thereon, the design shape of each electron-emitting device, and, if the substrate is to constitute a part of the envelope when the electron source is in use, an atmospheric pressure-resistant structure and other mechanical conditions for keeping the envelope in a vacuum state.

The glass material commonly employed is soda lime glass, which is inexpensive. The substrate preferably has on a soda lime glass plate a sodium block layer, for example, a silicon oxide film formed by sputtering to have a thickness of about 0.5 μm. Other than soda lime glass, glass containing less sodium or a quartz substrate is employable. This embodiment uses for the substrate electric glass for plasma displays which is reduced in alkaline content, specifically, PD-200, a product of Asahi Glass Co., Ltd.

Device electrodes 2 and 3 are formed from a common conductive material. For example, metals such as Ni, Cr, Au, Mo, Pt, and Ti and metal alloys such as Pd—Ag are suitable. Alternatively, an appropriate material is chosen from a printed conductor composed of a metal oxide, glass and others, a transparent conductor such as ITO, and the like. The thickness of the electroconductive film for the device electrodes is preferably between several hundreds angstrom and a few μm.

A device electrode gap L, a device electrode length W, and the shapes of the device electrodes 2 and 3 at this time are set to suite the actual application mode of the electron-emitting device. Preferably, the gap L is from several thousands angstrom to 1 mm. Considering the voltage applied between the device electrodes and other factors, a more preferable gap between the device electrodes is 1 μm to 100 μm. Taking into account the electrode resistance and the electron emission characteristic, the device electrode length W is preferably a few μm to several hundreds μm.

A commercially-available paste containing metal particles such as platinum (Pt) may be applied to the device electrodes by offset printing or other printing methods.

A more precise pattern can be obtained through a process that includes application of a photosensitive paste containing platinum (Pt) or the like by screen printing or by a similar printing method, exposure to light using a photo mask, and development.

Thereafter, an electroconductive thin film 4, which serves as an electron source, is formed to extend across the device electrodes 2 and 3.

A fine particle film formed of fine particles is particularly preferable for the electroconductive thin film 4 since it can provide a satisfactory electron-emitting characteristic. The thickness of the electroconductive thin film 4 is appropriately set taking into consideration the step coverage for covering level differences of the device electrodes 2 and 3, the resistance between the device electrodes, forming operation conditions, which will be described later, and others. Preferably, the electroconductive thin film 4 has a thickness of a few angstrom to several thousands angstrom, more preferably, 10 angstrom to 500 angstrom.

According to the research made by the present inventor, a suitable electroconductive film material is palladium (Pd) in general but there are other options. In addition, there are several methods to form the electroconductive thin film 4 and a suitable one is selected from sputtering, baking after application of a solution, and the like.

The method chosen here is to apply an organic palladium solution and then bake to form a palladium oxide (PdO) film. The PdO film is subjected to energization heating in a reduction atmosphere in the presence of hydrogen, thereby changing the PdO film into a palladium (Pd) film, and at the same time, forming a fissure. The fissure serves as the electron-emitting region, which is denoted by 5.

Note that, although the electron-emitting region 5 is placed at the center of the electroconductive thin film 4 and has a rectangular shape in the drawings for conveniences' sake, they are a schematic expression and not the exact depiction of the position and shape of the actual electron-emitting region.

FIGS. 2 to 6 are plan views of a substrate with electron-emitting devices forming a matrix pattern. In FIGS. 2 to 6, reference numeral 21 denotes an electron source substrate, 22 and 23, device electrodes, and 24, Y direction wires. Denoted by 25 is an insulating film, 26, X direction wires, and 27, a surface conduction electron-emitting device film, which forms an electron-emitting region.

A method of forming these electron-emitting devices is described below with reference to FIGS. 2 to 6.

<Formation of the Glass Substrate and the Device Electrodes>

Figure 2:
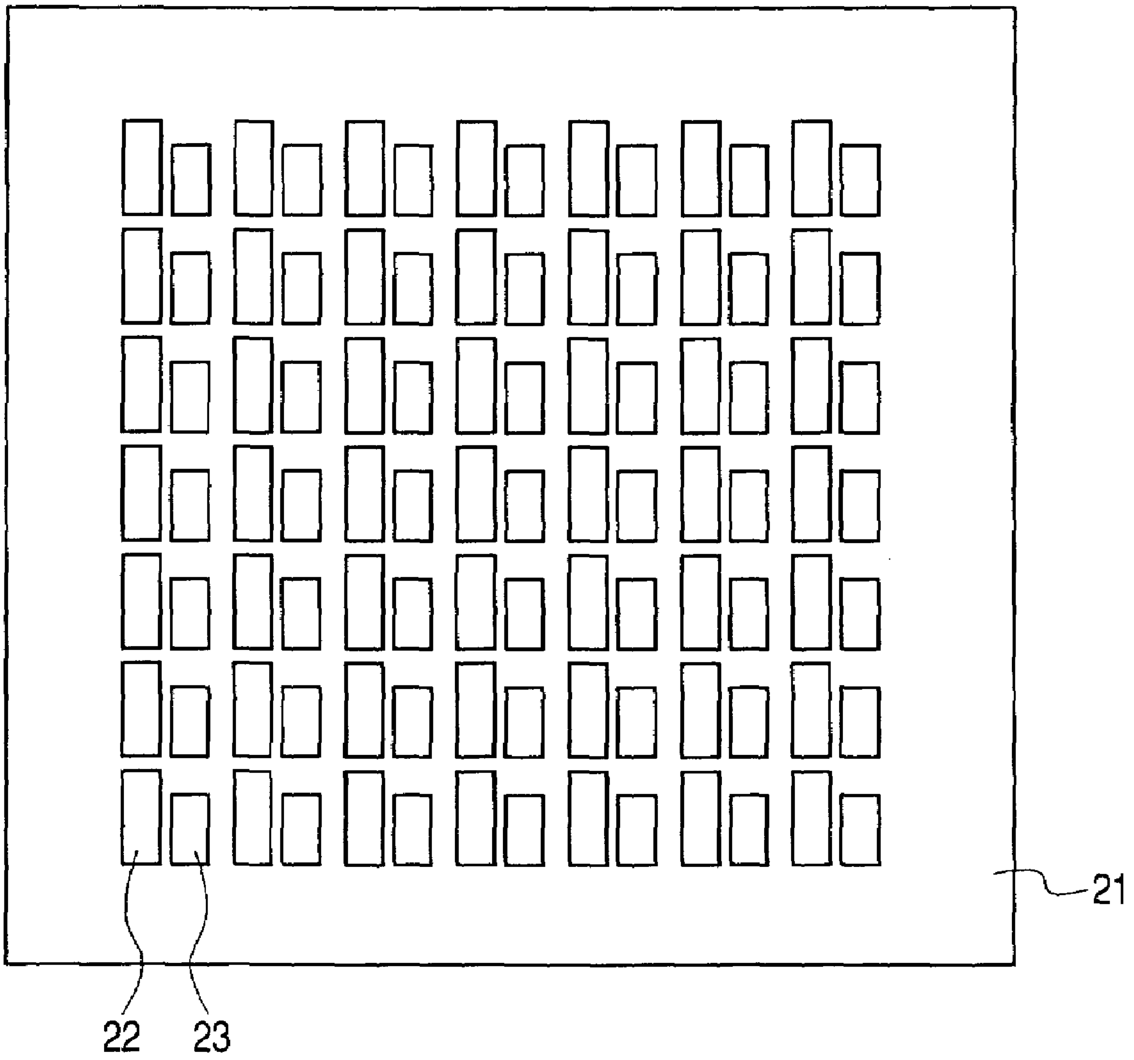
FIG. 2 is a process step diagram showing an example of an electron-emitting device manufacturing process (a stage where opposing electrodes are placed on a substrate)

In FIG. 2, a titanium (Ti) film with a thickness of 5 nm is formed first as an underlayer on the glass substrate 21 by sputtering. A platinum (Pt) film with a thickness of 40 nm is formed on the titanium film. The formation of the films is followed by a series of photolithography processes including application of photo resist, exposure to light, development, and etching. Through this patterning process, the device electrodes 22 and 23 are obtained.

In this embodiment, the device electrode gap L is set to 10 μm and the corresponding length W is set to 100 μm.

<Formation of the Lower Wires>

The X direction wires and the Y direction wires are desirably low-resistant, so that a large number of surface conduction electron-emitting devices can receive mostly equal voltage. Materials, thicknesses, and widths that can lower the wire resistance are appropriately chosen for the X direction wires and the Y direction wires.

Figure 3:
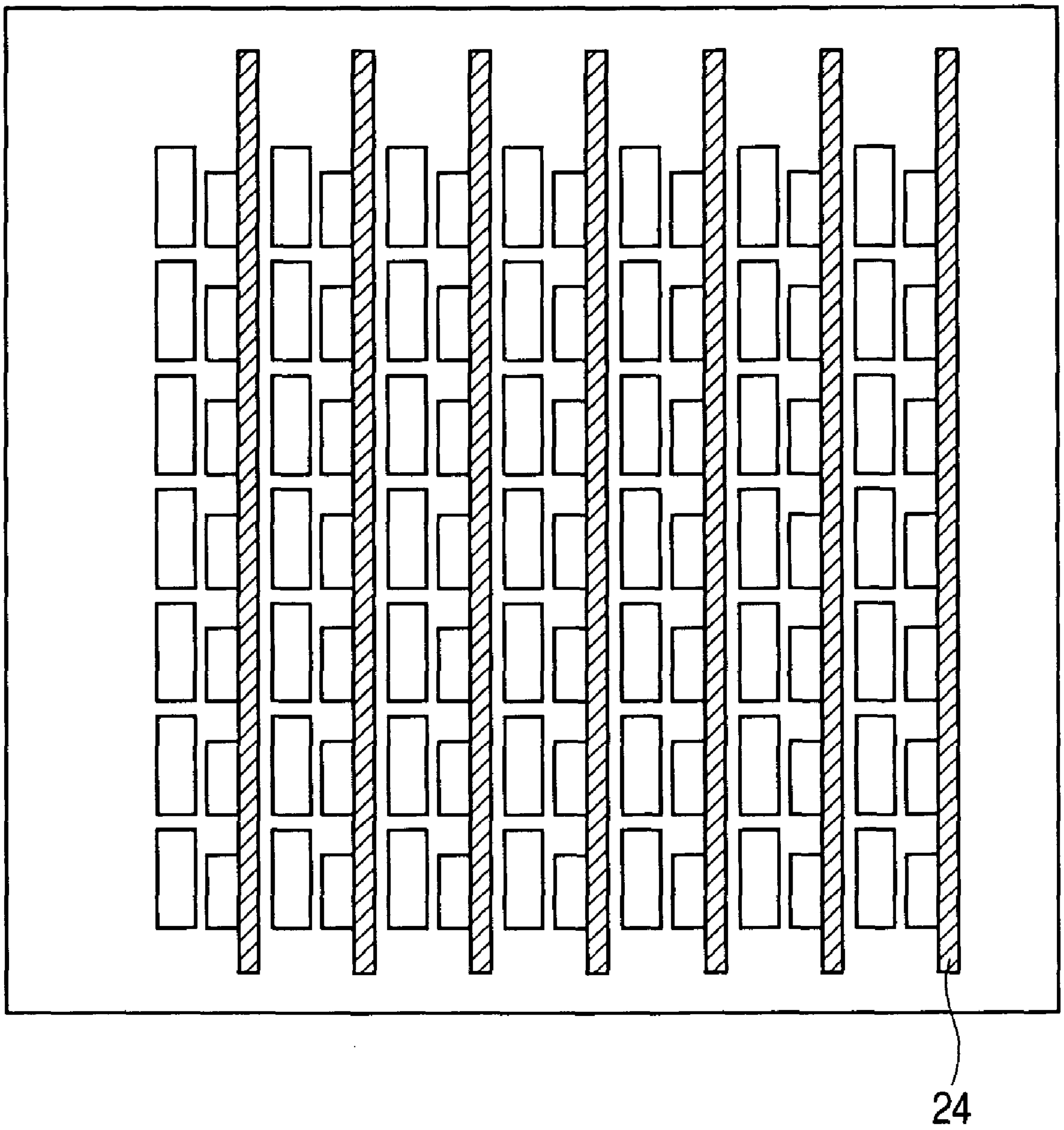
FIG. 3 is a process step diagram showing, as a continuation of FIG. 2, an example of an electron-emitting device manufacturing process (a stage where Y direction wiring is installed)

As shown in FIG. 3, the Y direction wires (lower wires) 24 as common wires form a line pattern that brings the wires 24 into contact with either the device electrodes 23 or the device electrodes 24 and links those device electrodes to one another. The material used for the wires 24 is silver (Ag) photo paste ink, which is applied by screen printing, let dry, and then exposed to light and developed into a given pattern. Baking at a temperature around 480° C. is the last step before the Y direction wires 24 are completed.

The Y direction wires 24 each have a thickness of about 10 μm and a width of about 50 μm. The wires 24 become wider toward their ends so that the ends can be used as wire lead-out electrodes.

<Formation of the Interlayer Insulating Film>

Figure 4:
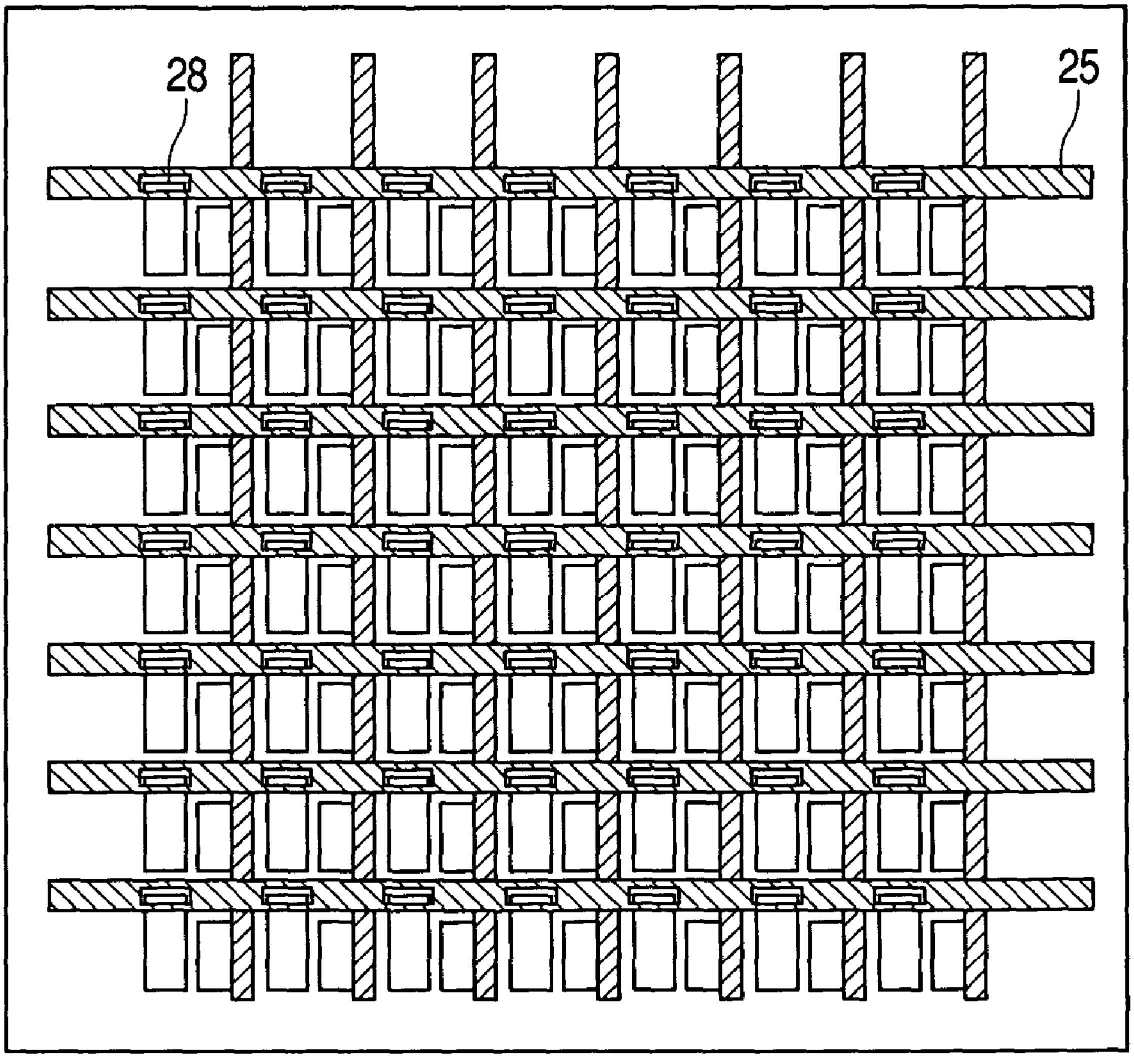
FIG. 4 is a process step diagram showing, as a continuation of FIG. 3, an example of an electron-emitting device manufacturing process (a stage where an insulating film is formed)

The interlayer insulating film 25 is placed in order to insulate the lower wires from upper wires. As shown in FIG. 4, the interlayer insulating film 25 is formed under the X direction wires (upper wires) 26, which will be described later, covering intersection points between the X direction wires 26 and the previously-formed Y direction wires (lower wires) 24. In the interlayer insulating film 25, contact holes 28 are opened at points where the X direction wires (upper wires) 26 are in contact with the device electrodes that are not connected to the Y direction wires 24, thereby allowing the wires 26 and the device electrodes to form electric connection.

A process of forming the interlayer insulating film 25 includes screen printing of a photosensitive glass paste that mainly contains PbO, exposure to light, and development. This process is repeated four times and lastly the four coats are baked at a temperature around 480° C. The interlayer insulating film 25 has a thickness of about 30 μm in total and a width of about 150 μm.

<Formation of the Upper Wires>

Figure 5:
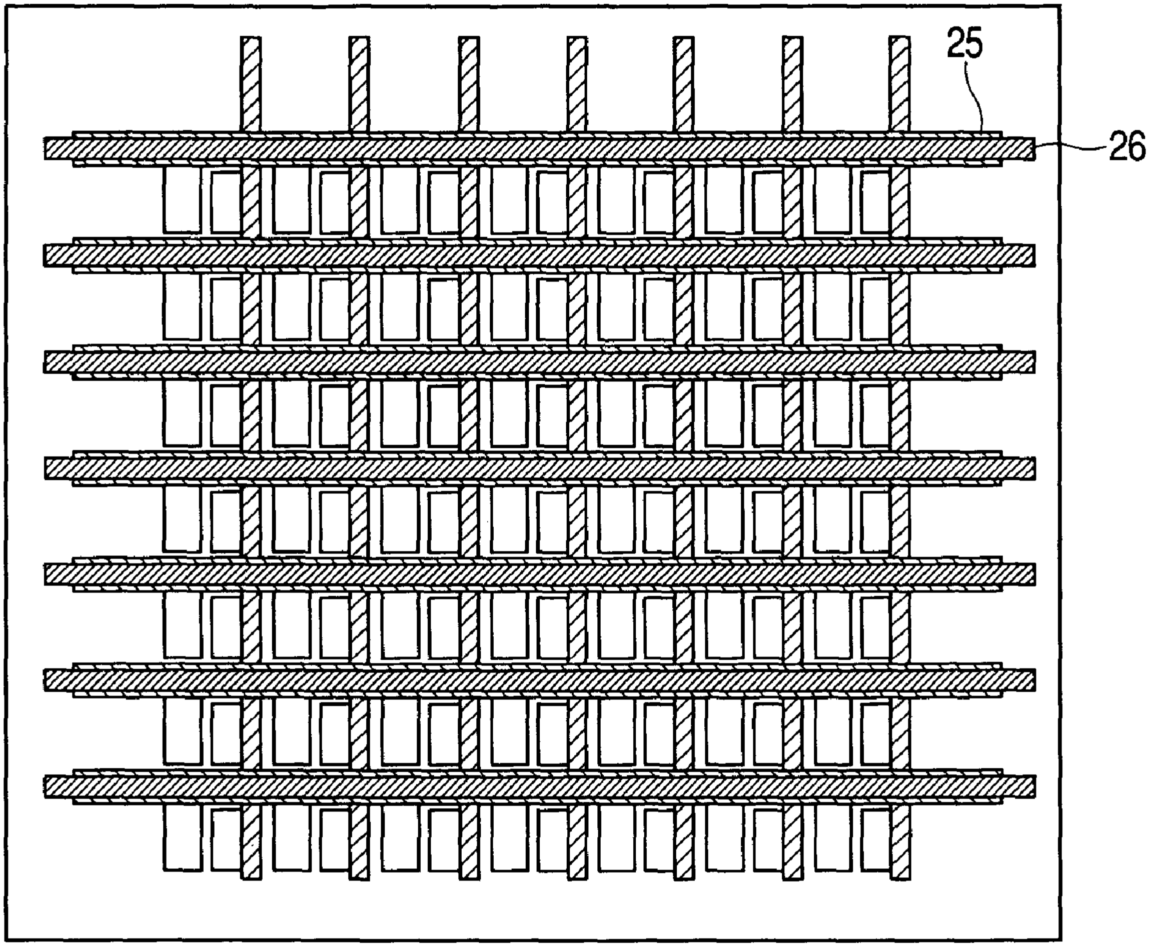
FIG. 5 is a process step diagram showing, as a continuation of FIG. 4, an example of an electron-emitting device manufacturing process (a stage where X direction wiring is installed)

To form the X direction wires (upper wires) 26, Ag paste ink is printed onto the previously-formed interlayer insulating film 25 by screen printing and let dry. The printing and drying is repeated to form two coats, which are then baked at a temperature around 480° C. As shown in FIG. 5, the X direction wires 26 intersect the Y direction wires (lower wires) 24 while sandwiching the interlayer insulating film 25 between them. The X direction wires 26 are connected, in the contact holes of the interlayer insulating film 25, to the device electrodes that are not connected to the Y direction wires 24.

The device electrodes that are not connected to the Y direction wires 24 are linked to one another by the X direction wires 26, and serve as scanning electrodes after the display device is made into a panel.

Each of the X direction wires 26 has a thickness of about 15 μm. A similar method is used to form lead-out wires connected to an external driver circuit.

Although not shown in the drawing, a similar method is used to form lead-out terminals connected to an external driver circuit.

A substrate having XY matrix wiring is thus obtained.

<Formation of the Device Film>

The above substrate is thoroughly cleaned and the surface is treated with a solution containing a water repellent agent to make the surface hydrophobic. This is to apply, in a subsequent step, an aqueous solution for forming the device film to the top faces of the device electrodes and spread the solution properly.

The water repellent agent employed is a DDS (dimethyl diethoxy silane) solution, which is sprayed onto the substrate and dried by hot air at 120° C.

Figure 6:
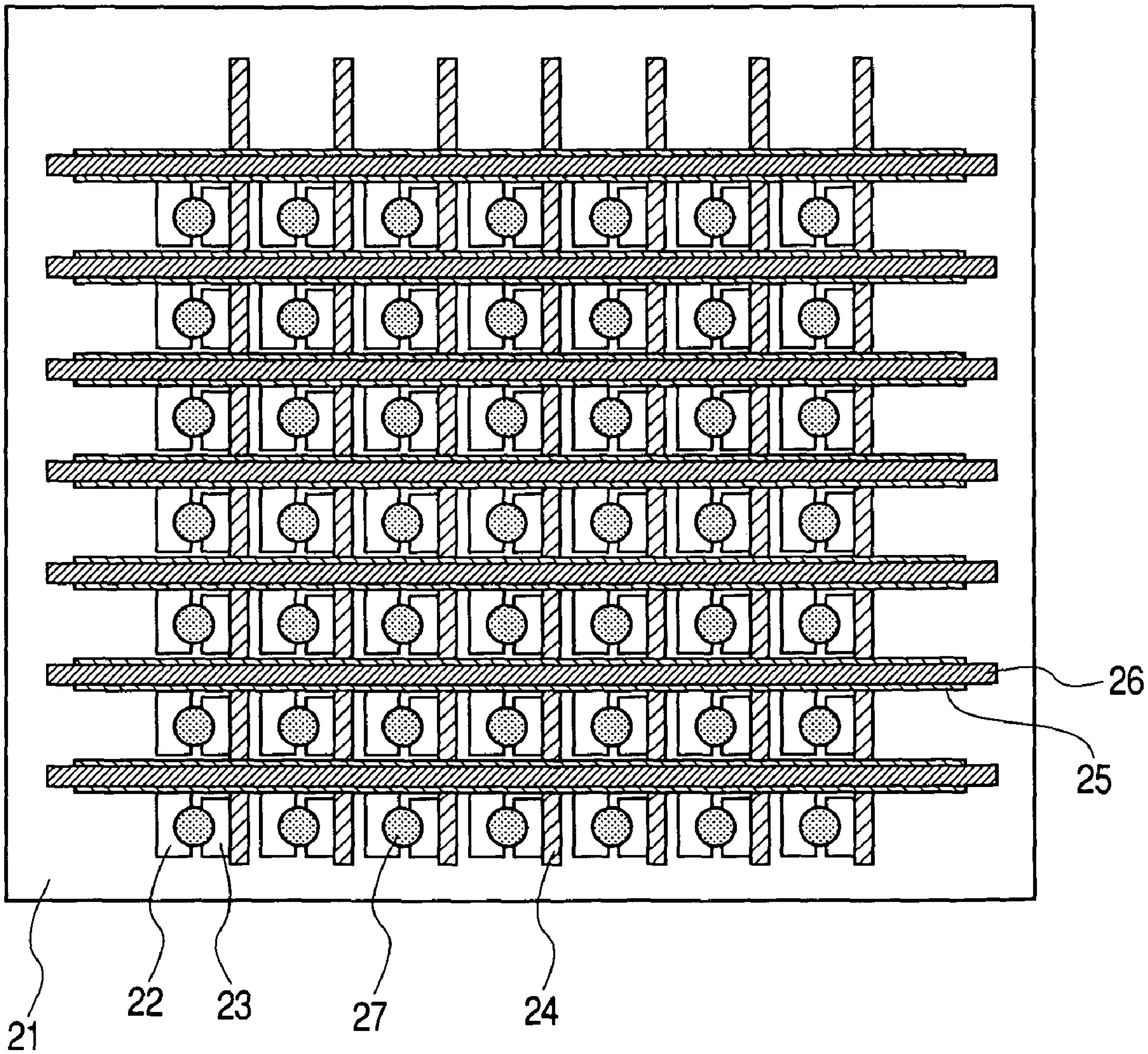
FIG. 6 is a process step diagram showing, as a continuation of FIG. 5, an example of an electron-emitting device manufacturing process (a stage where electron-emitting devices are formed)

Thereafter, the device film 27 is formed between the device electrodes by ink jet application as shown in FIG. 6.

This step is explained referring to the schematic diagrams of FIGS. 7A to 7D. In practice, in order to compensate fluctuation in plane among device electrodes on a substrate, the material for forming a device film is applied with precision at corresponding positions. This is achieved by measuring misalignment of the pattern at several points on the substrate and calculating linear approximation of the misalignment amount between measurement points for positional supplementation. Thus misalignment is adjusted for every pixel.

The device film 27 in this embodiment is a palladium film. First, 0.15 wt % of palladium-proline complex is dissolved in an aqueous solution containing water and isopropyl alcohol (IPA) at a ratio of 85:15 to obtain an organic palladium-containing solution. A few additives are added to the solution.

Figure 7A:
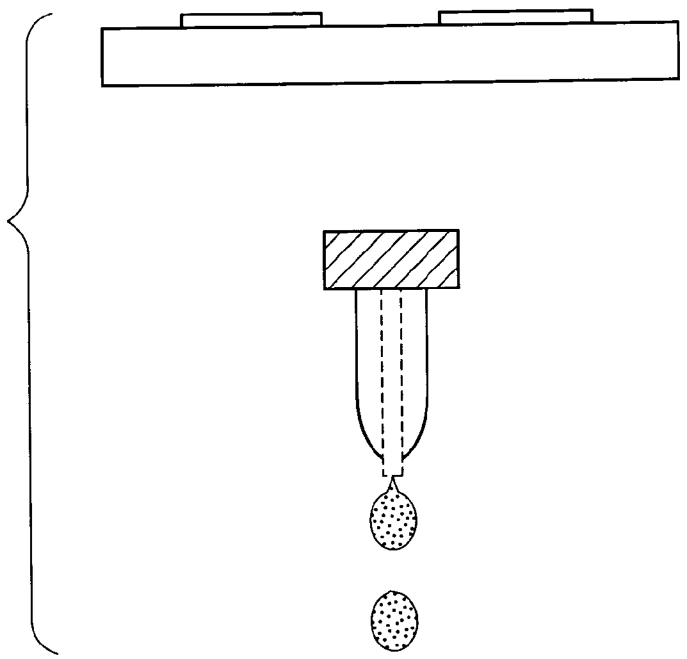
FIGS. 7A, 7B, 7C and 7D are process step diagrams showing an example of how a device film (electroconductive film) is formed by ink jet.
Figure 7B:
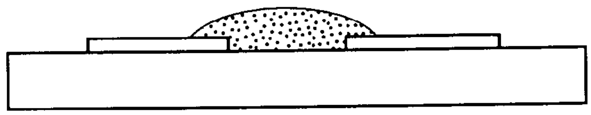
Figure 7C:
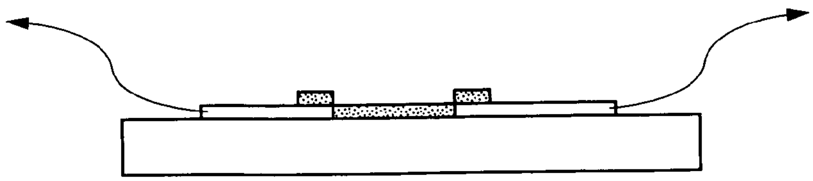

A drop of this solution is ejected from a dripping measure, specifically, an ink jet device with a piezoelectric element, to land between the electrodes after an adjustment is made to set the dot diameter to 60 μm (FIG. 7B). The substrate is then subjected to heat and bake processing in the air at 350° C. for 10 minutes to form a palladium oxide (PdO) film. The PdO film obtained has a dot diameter of about 60 μm and a thickness of 10 nm at maximum (FIG. 7C).

The flatness and homogenity of the obtained palladium oxide film greatly influence characteristics of electron-emitting devices to be formed.

Through the above steps, a palladium oxide (PdO) film is formed in an electron-emitting device portion.

<Reduction Forming>

Figure 8A:
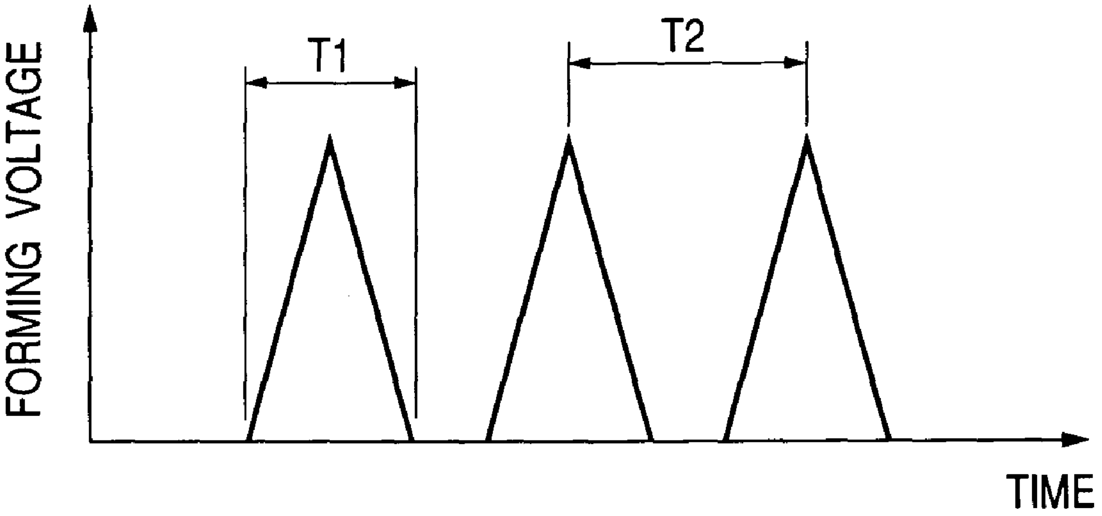
FIGS. 8A and 8B are graphs showing examples of voltage waveforms of energization forming.
Figure 8B:
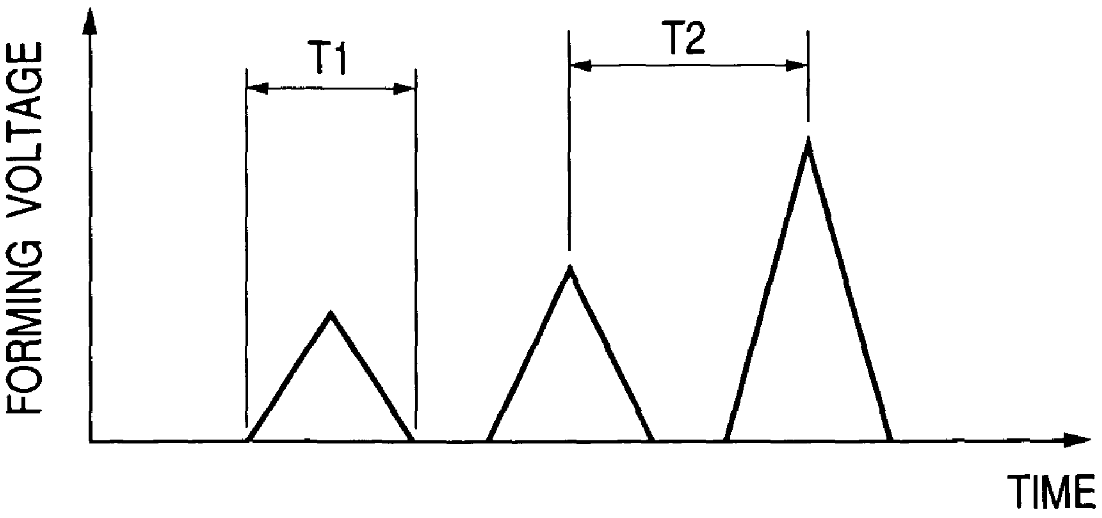

<<Description of FIG. 7C and FIGS. 8A and 8B >>:

Hood Forming

In this step called forming, the above electroconductive thin film is subjected to an energization operation to create a fissure within as an electron-emitting region.

Figure 7D:
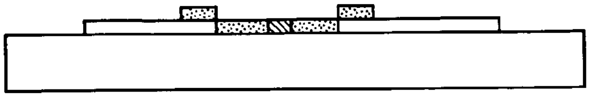

Specifically, the electron-emitting region is obtained as follows:

A vacuum space is created between the above-described substrate and a hood-like cover, which covers the entire substrate except the lead-out electrode portions on the perimeter of the substrate. Through electrode terminal portions, an external power supply applies a voltage between the X direction wires and the Y direction wires. Areas between the device electrodes are thus energized (FIG. 7C) to locally damage, deform, or modify the electroconductive thin film. The resultant electron-emitting region is highly electrically resistant (FIG. 7D).

If the energization heating is conducted in a vacuum atmosphere that contains a small amount of hydrogen gas at this time, hydrogen accelerates reduction and the palladium oxide (PdO) film is changed into a palladium (Pd) film.

During this change, the film shrinks from the reduction and a fissure is formed in a part of the film. The position and shape of the fissure are greatly influenced by the homogeneity of the original film.

In order to prevent fluctuation in characteristic among a large number of electron-emitting devices, the above fissure is preferably formed at the center of the electroconductive thin film and is as linear as possible.

At a given voltage, electrons are emitted also from regions surrounding the fissure that has been created by the forming. However, the emission efficiency is very low at this stage.

A resistance Rs of the obtained electroconductive thin film is from 102 Ω to 107 Ω.

The voltage waveforms used in the forming operation are briefly introduced with reference to FIGS. 8A and 8B.

The voltage applied in the forming operation has a pulse waveform. In one case, pulses are applied with the pulse wave height set to a constant voltage level (FIG. 8A) and, in the other case, pulses are applied while raising the pulse wave height in increments (FIG. 8B).

In FIG. 8A, T1 and T2 represent the pulse width and pulse interval of the voltage waveform, respectively. T1 is set to 1 μ second to 10 m seconds and T2 is set to 10 μ seconds to 100 m seconds. The wave height of the A-frame wave (the peak voltage in the forming operation) is chosen suitably.

T1 and T2 in FIG. 8B are identical to T1 and T2 in FIG. 8A, respectively. The wave height of the A-frame wave (the peak voltage in the forming operation) is increased in, for example, 0.1-V steps.

The device current is measured by inserting a pulse voltage at a level low enough to avoid local damage or deformation of the electroconductive film, for example, 0.1 V, between pulses for forming. Then, the resistivity is calculated from the measured device current. When the resistivity becomes, for example, 1000 times higher than the pre-forming operation resistance, it is time to end the forming operation.

<Activation—Carbon Deposition>

As mentioned in the above, the electron emission efficiency is low in this state.

In order to raise the electron emission efficiency, the electron-emitting device is desirably subjected to treatment called an activation operation.

The activation operation includes creating, similar to the forming operation, a vacuum space between a hood-like cover and the substrate at an appropriate vacuum level in the presence of an organic compound and then applying a pulse voltage repeatedly to the device electrodes through the X direction wires and the Y direction wires from the external. Then, gas containing carbon atoms is introduced to deposit carbon or a carbon compound originated from the gas in the vicinity of the above-described fissure and to form it into a carbon film.

This step employs tolunitrile as a carbon source. The gas tolunitrile is introduced through a slow leak valve into the vacuum space, and the pressure is maintained at $1.3\times10^{-4}$ Pa. Although the pressure of tolunitrile introduced is slightly influenced by the shape of the vacuum device, members used in the vacuum device, and the like, it is preferably $1\times10^{-5}$ Pa to $1\times10^{-2}$ Pa.

Figure 11A:
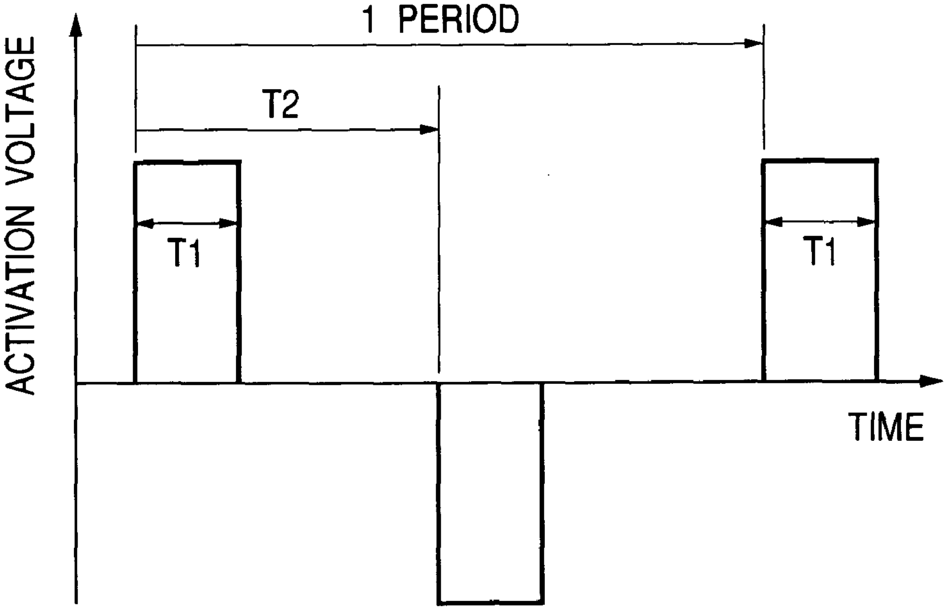
FIGS. 11A and 11B are graphs showing preferable examples of voltage application employed for activation of an electron-emitting device.
Figure 11B:
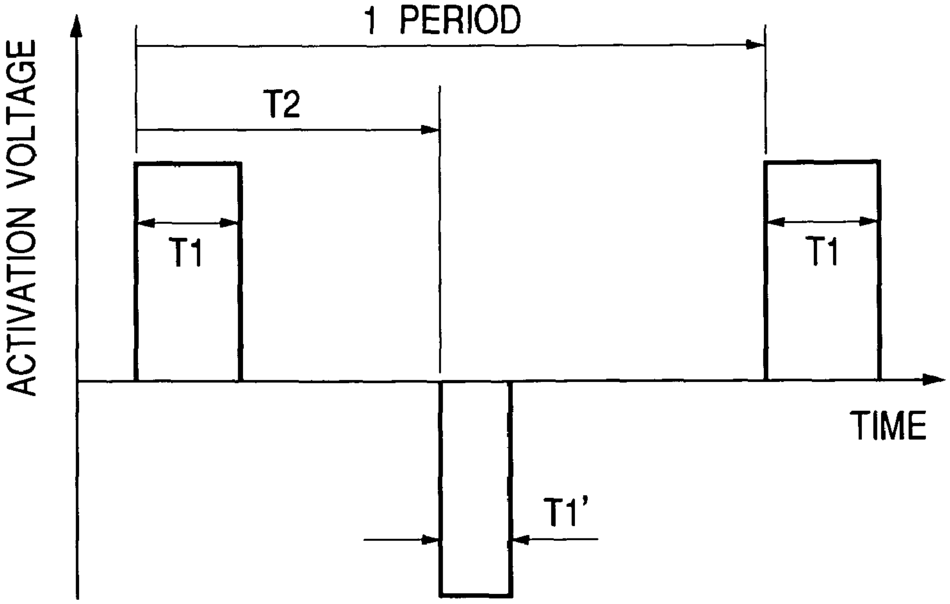

FIGS. 11A and 11B show preferred examples of voltage application employed in the activation step. The voltage applied has a maximum value appropriately chosen from between 10 V and 20 V. In FIG. 11A, T1 represents the pulse width of positive and negative pulses of the voltage waveform whereas T2 represents the pulse interval. The voltage values of a positive pulse and a negative pulse are set to have the same absolute value. In FIG. 11B, T1 and T' represent the pulse width of a positive pulse and the pulse width of a negative pulse of the voltage waveform, respectively, whereas T2 represents the pulse interval. T1 is set larger than T1'. The voltage values of a positive pulse and a negative pulse are set to have the same absolute value.

In the activation step, the voltage applied to the device electrodes 3 is the positive voltage. When a device current If flows from the device electrodes 3 to the device electrodes 2, the current flows in the positive direction. The energization is stopped after about 60 minutes, at which point an emission current Ie reaches near saturation. Then the slow leak valve is closed to end the activation operation.

Obtained through the above steps is a substrate having an electron source device.

<Substrate Characteristics>

Figure 9:
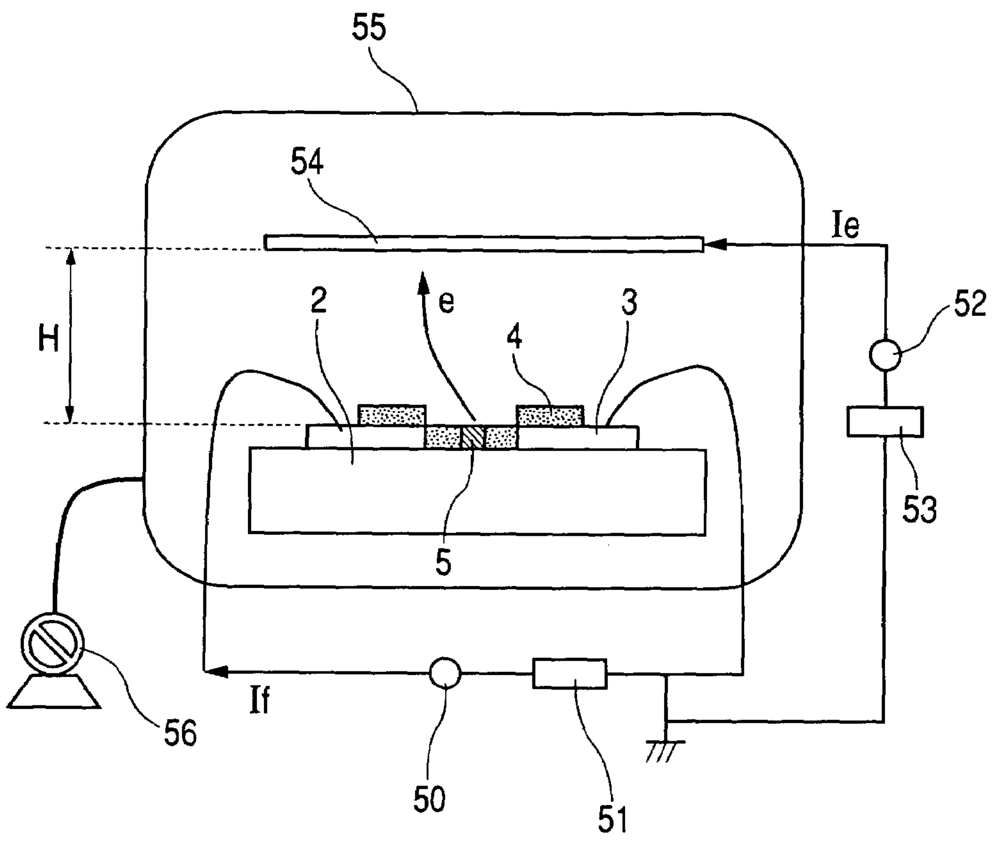
FIG. 9 is a schematic diagram showing an example of a device for measuring and evaluating an electron emission characteristic of an electron-emitting device.
Figure 10:
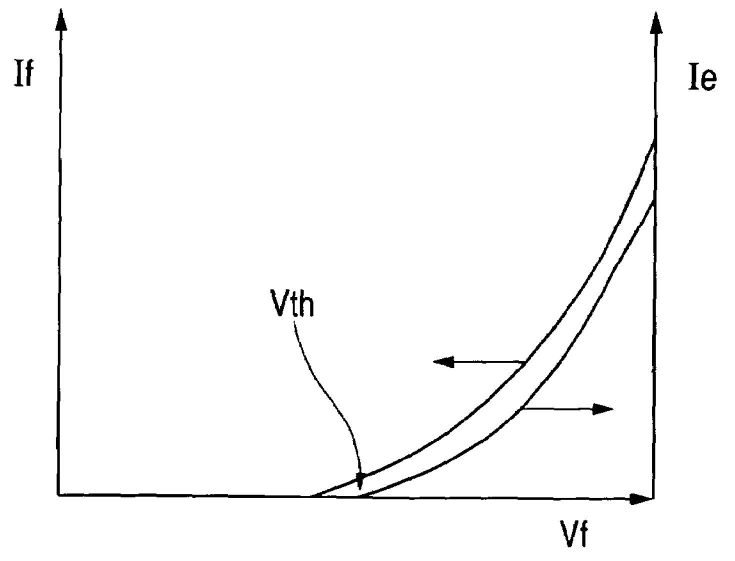
FIG. 10 is a graph showing an example of a characteristic of an electron-emitting device.

Referring to FIGS. 9 and 10, a description is given on basic characteristics of an electron-emitting device which is manufactured by the above-described method in accordance with the present invention to have the above-described device structure.

FIG. 9 is a diagram that outlines a measuring and evaluating device for measuring the electron emission characteristic of an electron-emitting device with the structure described above.

In FIG. 9, reference numerals 2 and 3 each denote a device electrode, 4, a thin film including an electron-emitting region (device film), and 5, the electron-emitting region. Denoted by 51 is a power supply for applying a device voltage Vf to the electron-emitting device. Reference numeral 50 is an ammeter for measuring a device current If that flows in a region of the electroconductive thin film 4 (including the electron-emitting region) that is between the device electrodes 2 and 3. Denoted by 54 is an anode electrode for capturing an emission current Ie that is discharged from the electron-emitting region of the electron-emitting device. Reference numeral 53 represents a high voltage power supply for applying a voltage to the anode electrode 54. Designated by 52 is an ammeter for measuring the emission current Ie that is discharged from the electron-emitting region 5 of the electron-emitting device. The power supply 51 and the ammeter 50 are connected to the device electrodes 2 and 3 and the anode electrode 54 to which the power supply 53 and the ammeter 52 are connected is placed above the electron-emitting device in order to measure the device current If that flows between the device electrodes of the electron-emitting device as well as the emission current Ie that is discharged to the anode.

This electron-emitting device and the anode electrode 54 are set in a vacuum device, which has all necessary equipment such as an exhaust pump 56 and a not-shown vacuum gauge, so that the electron-emitting device can be measured and evaluated at a desired vacuum level. The measurement is made with the anode electrode voltage set to 1 to 10 kV and a distance H between the anode electrode and the electron-emitting device set to 2 to 8 mm.

FIG. 10 shows the emission current Ie measured by the measuring and evaluating device of FIG. 9 and a typical example of the relation between the device current If and the device voltage Vf. The emission current Ie and the device current If are on largely different scales, and in FIG. 10, the axis of ordinate takes arbitrary units of measurement on a linear scale for qualitative comparison between a change of If and a change of Ie.

As a result of measuring the emission current Ie as a voltage of 12 V is applied between the device electrodes, the average emission current is 0.6 μA and the average electron emission efficiency is 0.15%. The Ie fluctuation between one electron-emitting device and another electron-emitting device is merely 5%, meaning that the electron-emitting devices have satisfactory uniformity.

This electron-emitting device has three characteristics regarding the emission current Ie.

Firstly, as is clear in FIG. 10, the emission current Ie of this electron-emitting device rapidly increases when a device voltage at a certain level (called threshold voltage, Vth in FIG. 10) or higher is applied. On the other hand, when the applied voltage is lower than the threshold voltage Vth, almost no emission current Ie is detected. This means that the electron-emitting device shows a characteristic as a non-linear device which has a definite threshold voltage Vth for the emission current Ie.

Secondly, the emission current Ie is dependent on the device voltage Vf and therefore can be controlled with the device voltage Vf.

Thirdly, emission charges captured by the anode electrode 54 are dependent on how long the device voltage Vf is applied. To rephrase, the amount of electric charges captured by the anode electrode 54 can be controlled by the time during which the device voltage Vf is applied.

<Panel>

Figure 13A:
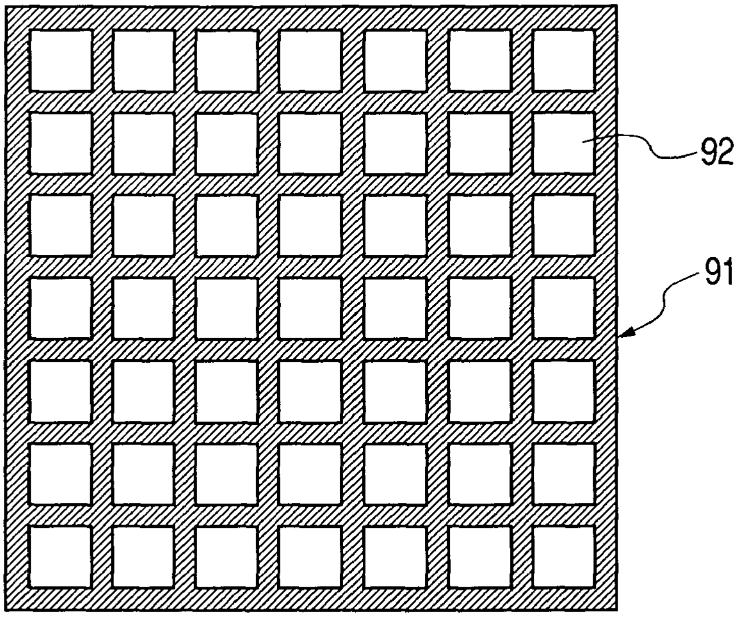
FIGS. 13A and 13B are schematic diagrams each illustrating a fluorescent film to be placed on a face plate.
Figure 13B:
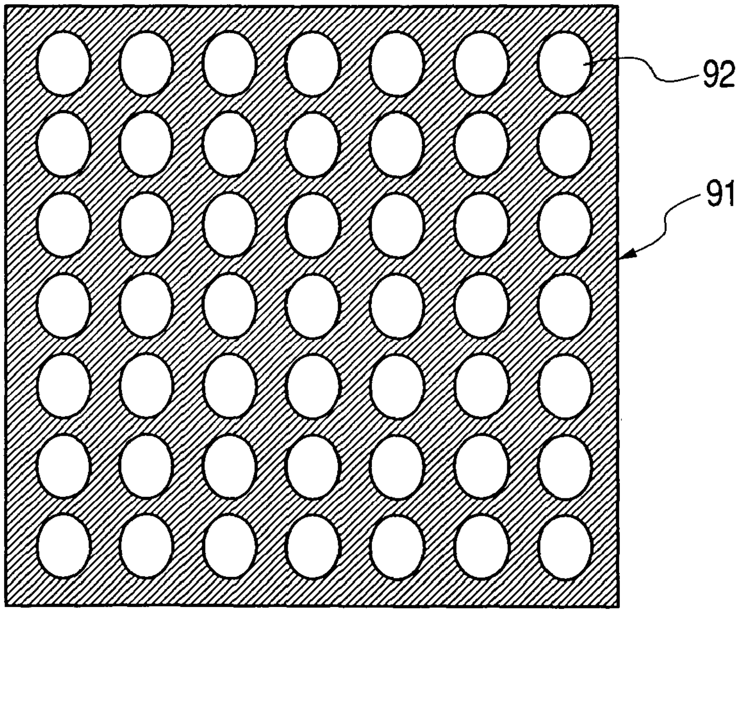

Descriptions are given with reference to FIG. 12 and FIGS. 13A and 13B on an example of an electron source that uses a passive matrix electron source substrate as the one described above and an example of image forming apparatus for display uses.

The envelope 90 is constructed by the above-described seal bonding process.

FIGS. 13A and 13B are explanatory diagrams of a fluorescent film 84, which is to be placed on the face plate. The fluorescent film 84 is formed solely of phosphors if it is a monochromatic film. If the fluorescent film 84 is a color fluorescent film, it is formed of black conductive materials 91 and phosphors 92. The black conductive materials 91 are called a black stripe or a black matrix depending on how the phosphors are arranged. The black stripe, or the black matrix is provided in order to make mixed colors or the like inconspicuous by painting gaps between the phosphors 92 of three different primary colors, which are necessary in color image display, black. The black stripe or the black matrix also helps to prevent external light from being reflected at the fluorescent film 84 and lowering the contrast.

A metal back 85 is usually placed on the inner side of the fluorescent film 84. The metal back is provided in order to improve the luminance by redirecting inward light out of light emitted from the phosphors toward the face plate 82 through specular reflection. The metal back 85 also acts as an anode electrode to which an electron beam acceleration voltage is applied. The metal back is formed by smoothening the inner surface of the fluorescent film (the smoothening treatment is usually called filming) after forming the fluorescent film and then depositing Al through vacuum evaporation or the like.

Similar to the rear plate 81, the face plate 82 is formed of electric glass for plasma displays which is reduced in alkaline content, specifically, PD-200, a product of Asahi Glass Co., Ltd. This glass material is free from the glass coloring phenomenon and, if formed into a 3 mm thick plate, provides enough blocking effect to prevent leakage of secondarily-generated soft X rays even when the display device is driven at an acceleration voltage of 10 kV or more.

If a color image is to be displayed, phosphors of different colors have to coincide with the electron-emitting devices and careful positioning by butting the upper and lower substrates against each other or the like is necessary in the seal bonding described above.

The vacuum level needed in the seal bonding is $10^{-6}$ Torr ($1\times10^{-4}$ Pa), and after the sealing, the vacuum level of the envelope 90 has to be maintained. This may be achieved by getter processing. In getter processing, immediately before sealing of the envelope 90 or after the sealing, a getter placed at a given position (not shown in the drawing) within the envelope is heated by resistance heating or high frequency heating to form an evaporation film. Usually, the getter contains Ba or the like as its main ingredient. The adsorption effect of the evaporation film keeps the vacuum level at $1\times10^{-5}$ to $1\times10^{-7}$ Torr ($1\times10^{-3}$ to $1\times10^{-5}$ Pa)

<Image Display Element>

According to the basic characteristics of the surface conduction electron-emitting device described above, electrons emitted from the electron-emitting region are controlled by the wave height and width of a pulse-like voltage applied between opposing device electrodes when the voltage is equal to or higher than the threshold voltage. The amount of current is also controlled by the intermediate value thereof and this makes it possible to display an image in halftone.

When there are a large number of electron-emitting devices, a scanning line signal is inputted to choose one scanning line and the above pulse-like voltage is applied to electron-emitting devices through information signal lines. In this way, a suitable voltage can be applied to any arbitrary electron-emitting device to turn the electron-emitting device ON.

Examples of a method of modulating an electron-emitting device in accordance with an input signal having halftone include voltage modulation and pulse width modulation.

A specific driving device is outlined below with reference to FIG. 14.

Figure 14:
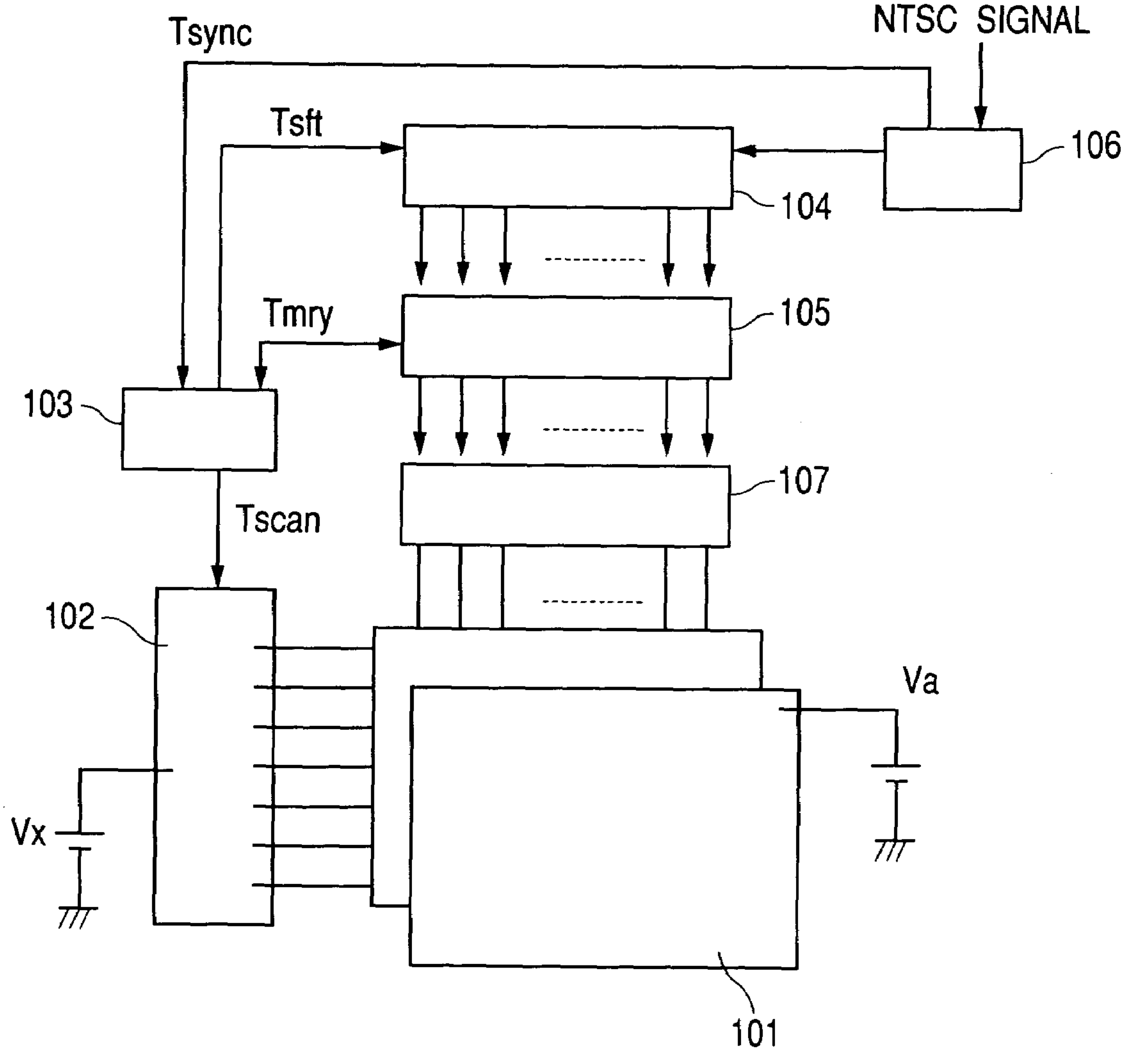
FIG. 14 is a schematic diagram showing a structural example of a driving device of an image forming apparatus.

FIG. 14 shows a structural example of an image display device which utilizes a display panel built from a passive matrix electron source and which receives NTSC television signals to display television programs.

In FIG. 14, reference numeral 101 denotes an image display panel, 102, a scanning circuit, 103, a control circuit, and 104, a shift register. Denoted by 105 is a line memory, 106 a sync signal separation circuit, 107, an information signal generator, and Vx and Va, direct current voltage sources.

The image display panel 101 using electron-emitting devices has X direction wires to which an X driver 102 is connected and Y direction wires to which the information signal generator 107 of a Y driver is connected. A scanning line signal is inputted to the X driver 102. An information signal is inputted to the Y driver.

When voltage modulation is employed, used as the information signal generator 107 is a circuit which produces voltage pulses of constant length while modulating the wave height of the pulses to suite inputted data. On the other hand, when pulse width modulation is employed, a circuit which produces voltage pulses of constant wave height while modulating the voltage pulse width to suite inputted data is used as the information signal generator 107.

The control circuit 103 generates control signals including Tscan, Tsft, and Tmry based on a synchronizing signal Tsync, which is sent from the sync signal separation circuit 106, and sends the control signals to the respective units.

The sync signal separation circuit 106 is a circuit for separating an NTSC television signal which is inputted from the external into a synchronizing signal component and a luminance signal component. The luminance signal component is inputted to the shift register 104 in sync with the synchronizing signal.

The shift register 104 serially receives luminance signals in time-series, puts the luminance signals under serial/parallel conversion one line of an image at a time, and operates in accordance with a shift clock sent from the control circuit 103. One line of image data that have undergone serial/parallel conversion (corresponding to drive data of n electron-emitting devices) are outputted as n parallel signals from the shift register 104.

The line memory 105 is a memory device for storing one line of image data for a necessary period. The stored data are inputted to the information signal generator 107.

The information signal generator 107 is a signal source for driving electron-emitting devices appropriately in accordance with the respective luminance signals. Signals outputted from the information signal generator 107 are inputted to the display panel 101 through the Y direction wires and are applied through the X direction wires to every electron-emitting device that intersects with a selected scanning line.

The X direction wires are sequentially scanned to drive the electron-emitting devices over the entire panel.

The image display device manufactured as above in accordance with this embodiment displays an image by applying a voltage to each electron-emitting device through X direction wires and Y direction wires within the panel to make the electron-emitting device emit electrons, and applying a high voltage through a high voltage terminal Hv shown in FIG. 12 to the metal back 85 which serves as an anode electrode to accelerate the emitted electron beam and crash the beam against the fluorescent film 84.

The image-forming apparatus structure described here is an example of the image-forming apparatus of the present invention and can be modified in various manners based on technical concepts of the present invention. Input signals are not limited to NTSC signals given here but may be PAL signals, HDTV signals, or others.

Embodiment 2

Figure 18:
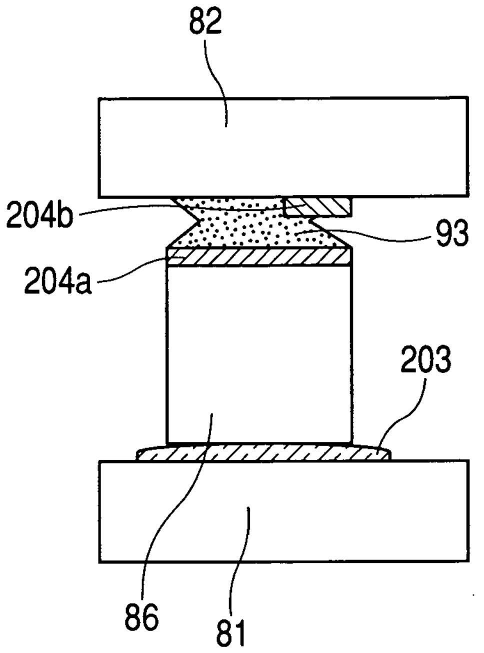
FIG. 18 is a schematic diagram which outlines a sectional structure of a peripheral portion of another example of an envelope according to the present invention.

FIG. 18 outlines a sectional structure of a bonding portion on the perimeter of an envelope according to another embodiment of the present invention. This embodiment is identical with Embodiment 1 except that the first region for ensuring the airtightness, namely, the underlayer 204*b*, of the face plate 82 which is the first substrate is formed only on the image display region side while the second region for ensuring the adhesion is formed only on the outside of the first region.

Embodiment 3

Figure 19:
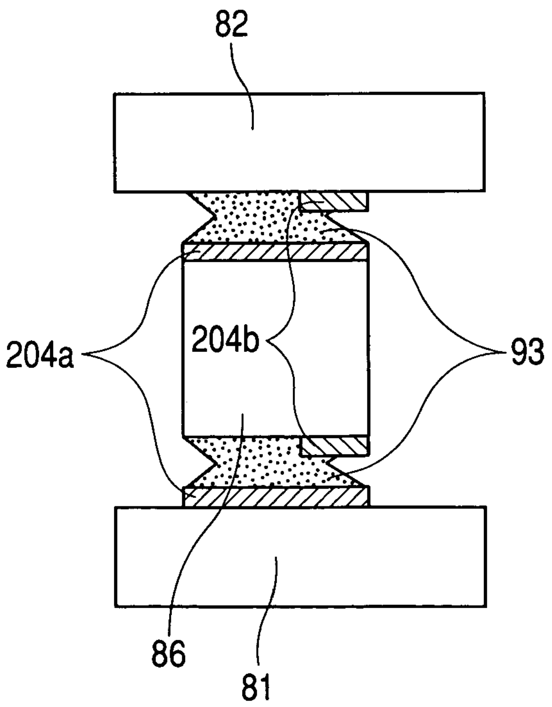
FIG. 19 is a schematic diagram which outlines a sectional structure of a peripheral portion of still another example of an envelope according to the present invention.

FIG. 19 outlines a sectional structure of a bonding portion on the perimeter of an envelope according to still another embodiment of the present invention.

In this embodiment, an In film is also used to bond the supporting frame 86 and the rear plate 81, which is the second substrate. On the side of the supporting frame 86 that faces the rear plate 81, the underlayer 204*b* is formed as the first region for ensuring the airtightness only on the image display region side while the second region for ensuring the adhesion is formed only on the outside of the first region. The rest of this embodiment is similar to Embodiment 2. Using In to bond the supporting frame 86 and the rear plate 81 to each other makes a low temperature bonding process possible.

The face plate serves as the first substrate and the rear plate serves as the second substrate in the above embodiments. Specifically, Embodiment 1 describes a structure in which the face plate serving as the first substrate has first regions and a second region whereas Embodiment 3 describes a structure in which a first region and a second region are located on the side of the supporting frame that is bonded to the rear plate serving as the second substrate. However, using the face plate as the first substrate and the rear plate as the second substrate is merely for the convenience of explanation and the present invention is not limited thereto. The rear plate may have a bonding face on which a first region and a second region are placed, or the side of the supporting frame that is bonded to the face plate may have a first region and a second region.

In the structures described above, a region where a film is formed on a host material of a substrate serves as the first region whereas a region where the host material of the substrate is exposed serves as the second region. However, the present invention is not limited thereto, and for example, the second region may be a region where the host material of the substrate is covered with a film having a different composition from that of the film of the first region.

The seal bonding process is conducted in a vacuum environment in Embodiments 1, 2, and 3 described above. However, the present invention is effective also when an envelope having a vacuum gap is obtained by conducting seal bonding under atmospheric pressure and then exhausting the interior of the panel through an exhaust substrate hole, which is formed after the seal bonding. When seal bonding is conducted under atmospheric pressure, the oxide film on the surface of the low melting point metal is thicker and therefore the structural effect of the present invention, which makes it easier to break the oxide film, is more prominent.

In the embodiments described above, influence of the oxide film on the surface of the low melting point metal is lessened to improve the yield, and the low temperature bonding process makes it possible to maintain a high vacuum level at low cost as well as to render the envelope break-proof.

What is claimed is:

1. An image display device, comprising an envelope whose inside is maintained in a reduced pressure atmosphere, the envelope comprising:

a first substrate;

a second substrate opposed to the first substrate; and a frame interposed between the first substrate and the second substrate wherein a portion of the first substrate opposed to the frame has first areas covered each with a first metal film and a second area not covered with the first metal film, and wherein the first substrate and the frame are seal-bonded with a low melting point metal, the low melting point metal being brought into contact with the first metal film and the first substrate in the second area, the second area being interposed between the first areas.

2. A television display device, comprising:

the image display device according to claim 1, wherein the image display device receives a television signal.

3. The image display device according to claim 1, wherein a vacuum level in the envelope is kept at $1\times10^{-3}$ to $1\times10^{-5}$ Pa.

4. The image display device of claim 1, wherein the envelope further comprises a second metal film at a face of the frame opposed to the first substrate, which is brought into contact with the low melting point metal.

5. The image display device according to claim 4, wherein each of the first and second metal films comprises a silver film, an ITO film or a Pt film.

6. The image display device according to claim 1, wherein the low melting point metal comprises In, Sn or an alloy containing In or Sn.

7. An image display device, comprising an envelope whose inside is maintained in a reduced pressure atmosphere, the envelope comprising:

a first substrate;

a second substrate opposed to the first substrate; and a frame interposed between the first substrate and the second substrate, wherein a portion of the frame opposed to the first substrate has first areas covered each with a first metal film and a second area not covered with the first metal film, and wherein the first substrate and the frame are seal-bonded with a low melting point metal, the low melting point metal being brought into contact with the first metal film and the frame in the second area, the second area being interposed between the first areas.

8. A television display device, comprising:

the image display device according to claim 7, wherein the image display device receives a television signal.

9. The image display device according to claim 7, wherein a vacuum level in the envelope is kept at $1\times10^{-3}$ to $1\times10^{-5}$ Pa.

* * * * *

UNITED STATES PATENT AND TRADEMARK OFFICE

CERTIFICATE OF CORRECTION

PATENT NO. : 7,368,866 B2
APPLICATION NO. : 10/647287
DATED : May 6, 2008
INVENTOR(S) : Hasegawa et al.

It is certified that error appears in the above-identified patent and that said Letters Patent is hereby corrected as shown below:

On the Title page,

[*] Notice: Subject to any disclaimer, the term of this patent is extended or adjusted under 35 USC 154(b) by (144) days Delete the phrase "by 144 days" and insert -- by 24 days --

Signed and Sealed this

Fourteenth Day of October, 2008

JON W. DUDAS
*Director of the United States Patent and Trademark Office*

UNITED STATES PATENT AND TRADEMARK OFFICE

CERTIFICATE OF CORRECTION

PATENT NO. : 7,368,866 B2 
APPLICATION NO. : 10/647287
DATED : May 6, 2008
INVENTOR(S) : Mitsutoshi Hasegawa et al.

It is certified that error appears in the above-identified patent and that said Letters Patent is hereby corrected as shown below:

ON THE TITLE PAGE (57):

Line 9, ABSTRACT, "higher maintaining" should read --maintaining higher--.

COLUMN 1:

Line 16, "referred to" should read --referred to as all--;
Line 17, "referred to" should read --referred to as all--;
Line 19, "referred to" should read --referred to as all--; and
Line 58, "glass" should read --glass,--.

COLUMN 2:

Line 17, "produces" should be deleted;
Line 26, "is to provide" should read --to provide--;
Line 29, "inventor" should read --inventors--;
Line 49, "envelop" should read --envelope--;
Line 51, "therebetween:" should read --therebetween;--;
Line 54, "higher maintaining" should read --maintaining higher--; and
Line 64, "envelop" should read --envelope--.

COLUMN 3:

Line 3, "higher maintaining" should read --maintaining higher--; and
Line 32, "higher maintaining" should read --maintaining higher--.

COLUMN 4:

Line 62, "after adhered" should read --after being adhered--.

COLUMN 5:

Line 46, "keeping" should read --continuing--; and
Line 47, "supplying" should read --to supply--.

UNITED STATES PATENT AND TRADEMARK OFFICE

CERTIFICATE OF CORRECTION

PATENT NO. : 7,368,866 B2 
APPLICATION NO. : 10/647287
DATED : May 6, 2008
INVENTOR(S) : Mitsutoshi Hasegawa et al.

It is certified that error appears in the above-identified patent and that said Letters Patent is hereby corrected as shown below:

COLUMN 6:

Line 36, "boned" should read --bonded--; and
Line 48, "present. As" should read --present; as--.

COLUMN 7:

Line 34, "to suite" should read --to suit--; and
Line 62, "to suite" should read --to suit--.

COLUMN 8:

Line 26, "inventor," should read --inventors,--; and
Line 45, "conveniences'" should read --convenience's--.

COLUMN 10:

Line 38, "homogenity" should read --homogeneity--.

COLUMN 11:

Line 5, "in characteristic" should read --characteristic--; and
Line 39, "in the" should be deleted.

COLUMN 12:

Line 2, "T1 and T'" should read --T1 and T1'--.

COLUMN 14:

Line 2, "devices" should read --devices,--;
Line 18, "$1x10^{-5}$ Pa)" should read --$1x10^{-5}$ Pa).--;

UNITED STATES PATENT AND TRADEMARK OFFICE

CERTIFICATE OF CORRECTION

PATENT NO. : 7,368,866 B2

APPLICATION NO. : 10/647287

DATED : May 6, 2008

INVENTOR(S) : Mitsutoshi Hasegawa et al.

It is certified that error appears in the above-identified patent and that said Letters Patent is hereby corrected as shown below:

COLUMN 14 (continued):

Line 61, "to suite" should read --to suit--; and
Line 64, "to suite" should read --to suit--.

Signed and Sealed this

Eleventh Day of November, 2008

JON W. DUDAS
*Director of the United States Patent and Trademark Office*